US012690334B2

(12) United States Patent
Kim et al.

(10) Patent No.: US 12,690,334 B2
(45) Date of Patent: Jul. 21, 2026

(54) DISPLAY PANEL

(71) Applicant: Samsung Display Co., Ltd., Yongin-Si (KR)

(72) Inventors: Kiwook Kim, Yongin-si (KR); Kwang-Min Kim, Yongin-si (KR); Do Yeon Hwang, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 418 days.

(21) Appl. No.: 18/221,892

(22) Filed: Jul. 14, 2023

(65) Prior Publication Data

US 2024/0188334 A1 Jun. 6, 2024

(30) Foreign Application Priority Data

Dec. 5, 2022 (KR) ........................ 10-2022-0167479

(51) Int. Cl.
H10K 59/122 (2023.01)
H10K 59/88 (2023.01)
*H10K 102/00* (2023.01)

(52) U.S. Cl.
CPC ........... H10K 59/122 (2023.02); H10K 59/88 (2023.02); *H10K 2102/351* (2023.02)

(58) Field of Classification Search
CPC ................. H10K 59/122; H10K 59/88; H10K 2102/351; H10K 50/19; H10K 59/352; H10K 59/353; H10K 59/805; H10K 50/13; H10K 50/15; H10K 50/16; H10K 50/17; H10K 50/81; H10K 50/82; Y02E 10/549
See application file for complete search history.

(56) References Cited

U.S. PATENT DOCUMENTS

| | | | |
|---|---|---|---|
| 11,063,096 B2 | 7/2021 | Heo | |
| 2021/0280647 A1* | 9/2021 | Han | H10K 59/353 |
| 2022/0085125 A1* | 3/2022 | Yun | H10K 59/124 |
| 2022/0157905 A1* | 5/2022 | Kinjo | H10K 59/353 |
| 2022/0246698 A1 | 8/2022 | Kim et al. | |

FOREIGN PATENT DOCUMENTS

| | | |
|---|---|---|
| JP | 2022-080003 A | 5/2022 |
| KR | 10-2015-0017612 A | 2/2015 |
| KR | 10-1948898 B1 | 2/2019 |
| KR | 10-2021-0114094 A | 9/2021 |

* cited by examiner

*Primary Examiner* — Donald L Raleigh

(74) *Attorney, Agent, or Firm* — Innovation Counsel LLP

(57) ABSTRACT

Provided is a display panel including a base layer including a first pixel region, a second pixel region at least partially spaced apart from the first pixel region in a first direction, and a non-pixel region adjacent to the first and second pixel regions, a pixel defining layer having first and second pixel openings defined in the pixel defining layer and respectively corresponding to the first and second pixel regions, and a light-emitting portion including a charge generation layer, wherein the pixel defining layer includes at least one first valley region and at least one first non-valley region disposed on a first virtual line completely enclosing the first pixel opening and at least one second valley region and at least one second non-valley region disposed on a second virtual line completely enclosing the second pixel opening.

32 Claims, 17 Drawing Sheets

DISPLAY PANEL

CROSS-REFERENCE TO RELATED APPLICATIONS

This U.S. non-provisional patent application claims priority under 35 U.S.C. § 119 of Korean Patent Application No. 10-2022-0167479, filed on Dec. 5, 2022, the entire contents of which are hereby incorporated by reference.

BACKGROUND

The present disclosure herein relates to a display panel, and more particularly, to a display panel having improved luminance and preventing color mixing.

Electronic devices, such as a smart phone, a tablet computer, a digital camera, a notebook computer, a navigation system, and a television, which provide an image to a user, include a display panel for displaying an image.

In the display panel, pixels may be divided into red, green, and blue pixels for color display, and a light-emitting layer corresponding to each color may be formed for each pixel. In general, a deposition method using a shadow mask has been used for the light-emitting layer, but defects such as sagging of the mask may occur. Therefore, a process has been developed in which the light-emitting layer and additional organic layer are formed in common in all pixels by using an open mask.

However, when the organic layer is commonly formed, a lateral leakage current may occur due to the organic layer commonly provided between adjacent pixels, and because of this, color mixing and luminance defects may occur between the adjacent pixels.

SUMMARY

The present disclosure provides a display panel capable of preventing color mixing between adjacent pixels and luminance decrease by preventing the occurrence of a lateral leakage current between the adjacent pixels.

An embodiment of the inventive concept provides a display panel including: a base layer; a pixel defining layer; and a light-emitting portion. The base layer includes a first pixel region, a second pixel region at least partially spaced apart from the first pixel region in a first direction, and a non-pixel region adjacent to the first and second pixel regions. The pixel defining layer is disposed on the base layer and has first and second pixel openings which are defined in the pixel defining layer and respectively correspond to the first and second pixel regions. The light-emitting portion overlaps the first and second pixel regions, is disposed on the pixel defining layer, and includes a charge generation layer. The pixel defining layer includes: at least one first valley region and at least one first non-valley region disposed on a first virtual line completely enclosing the first pixel opening; and at least one second valley region and at least one second non-valley region disposed on a second virtual line completely enclosing the second pixel opening. The at least one first non-valley region and the at least one second non-valley region do not face each other, and a shortest distance between the at least one first non-valley region and the at least one second non-valley region is about 10 micrometers or more.

In an embodiment, the at least one first non-valley region may be disposed between one end of the at least one first valley region and an other end of the at least one first valley region.

In an embodiment, the at least one first valley region may include (1-1)-th and (1-2)-th valley regions spaced apart from each other, and the at least one first non-valley region may include (1-1)-th and (1-2)-th non-valley regions extending in a same direction as each other. The (1-1)-th non-valley region may be disposed between one end of the (1-1)-th valley region and one end of the (1-2)-th valley region, and the (1-2)-th non-valley region may be disposed between an other end of the (1-1)-th valley region and an other end of the (1-2)-th valley region.

In an embodiment, a length of the (1-1)-th non-valley region in an extension direction of the (1-1)-th non-valley region and a length of the (1-2)-th non-valley region in an extension direction of the (1-2)-th non-valley region may be equal to each other. At least a portion of the (1-1)-th non-valley region may overlap the (1-1)-th valley region when viewed from a direction perpendicular to the extension direction of the (1-1)-th non-valley region.

In an embodiment, a length of the (1-1)-th non-valley region in an extension direction of the (1-1)-th non-valley region and a length of the (1-2)-th non-valley region in an extension direction of the (1-2)-th non-valley region may be different from each other.

In an embodiment, the at least one first non-valley region may extend in a second direction perpendicular to the first direction, and the at least one second non-valley region may extend in any one of the first and second directions.

In an embodiment, a plurality of second pixel regions include the second pixel region and a plurality of second pixel openings include the second pixel opening. The plurality of second pixel regions may include (2-1)-th pixel regions and (2-2)-th pixel regions that are alternately arranged in the second direction. The plurality of second pixel openings may include (2-1)-th pixel openings respectively corresponding to the (2-1)-th pixel regions and (2-2)-th pixel openings respectively corresponding to the (2-2)-th pixel regions. The second virtual line may completely enclose a (2-1)-th pixel opening and a (2-2)-th pixel opening, which are adjacent to each other, among the (2-1)-th pixel openings and the (2-2)-th pixel openings.

In an embodiment, the second pixel regions may emit light having a wavelength shorter than a wavelength of light emitted from the first pixel regions.

In an embodiment, the at least one second valley region may include (2-1)-th and (2-2)-th valley regions spaced apart from each other. The at least one second non-valley region may include (2-1)-th and (2-2)-th non-valley regions extending in a same direction as each other. The (2-1)-th non-valley region may be adjacent to the (2-1)-th pixel opening and disposed between one end of the (2-1)-th valley region and one end of the (2-2)-th valley region. The (2-2)-th non-valley region may be adjacent to the (2-2)-th pixel opening and disposed between an other end of the (2-1)-th valley region and an other end of the (2-2)-th valley region.

In an embodiment, each of the (2-1)-th and (2-2)-th non-valley regions may extend in the first direction, and the (2-1)-th and (2-2)-th non-valley regions may be spaced apart from each other in the second direction with the (2-1)-th and (2-2)-th pixel openings interposed between the (2-1)-th and (2-2)-th non-valley regions.

In an embodiment, each of the (2-1)-th and (2-2)-th non-valley regions may extend in the second direction, and a direction in which the (2-1)-th non-valley region is spaced apart from the (2-1)-th pixel opening and a direction in which the (2-2)-th non-valley region is spaced apart from the (2-2)-th pixel opening may be opposite to each other.

In an embodiment, the at least one second valley region may include (2-1)-th, (2-2)-th, (2-3)-th, and (2-4)-th valley regions spaced apart from each other. The at least one second non-valley region may include (2-1)-th, (2-2)-th, (2-3)-th, and (2-4)-th non-valley regions extending in the second direction. The (2-1)-th non-valley region may be disposed between one end of the (2-1)-th valley region and one end of the (2-2)-th valley region. The (2-2)-th non-valley region may be disposed between an other end of the (2-2)-th valley region and one end of the (2-3)-th valley region. The (2-3)-th non-valley region may be disposed between an other end of the (2-3)-th valley region and one end of the (2-4)-th valley region. The (2-4)-th non-valley region may be disposed between an other end of the (2-4)-th valley region and an other end of the (2-1)-th valley region.

In an embodiment, each of the (2-1)-th and (2-2)-th non-valley regions may be adjacent to the (2-1)-th pixel opening, the (2-1)-th and (2-2)-th non-valley regions may be respectively spaced apart from the (2-1)-th pixel opening in the first direction and in a direction opposite to the first direction. Each of the (2-3)-th and (2-4)-th non-valley regions may be adjacent to the (2-2)-th pixel opening, and the (2-3)-th and (2-4)-th non-valley regions may be respectively spaced apart from the (2-2)-th pixel opening in the first direction and in the direction opposite to the first direction.

In an embodiment, the at least one first non-valley region may extend in the first direction, and the at least one second non-valley region may extend in a second direction perpendicular to the first direction.

In an embodiment, the second pixel regions may emit light having a wavelength longer than a wavelength of light emitted from the first pixel regions.

In an embodiment, the at least one second non-valley region may be disposed between one end of the at least one second valley region and an other end of the at least one second valley region.

In an embodiment, the at least one second valley region may include (2-1)-th and (2-2)-th valley regions spaced apart from each other. The at least one second non-valley region may include (2-1)-th and (2-2)-th non-valley regions. The (2-1)-th non-valley region may be disposed between one end of the (2-1)-th valley region and one end of the (2-2)-th valley region. The (2-2)-th non-valley region may be disposed between an other end of the (2-1)-th valley region and an other end of the (2-2)-th valley region.

In an embodiment, the (2-1)-th non-valley region may entirely overlap the (2-2)-th non-valley region when viewed from the first direction.

In an embodiment, the (2-1)-th non-valley region may overlap at least one of the (2-1)-th and (2-2)-th valley regions when viewed from the first direction.

In an embodiment, the base layer may further include a third pixel region emitting light of a color different from a light emitted from the first pixel region and a light emitted from the second pixel region. The pixel defining layer may have a third pixel opening defined in the pixel defining layer, spaced apart from the first and second pixel openings, and corresponding to a third pixel region.

In an embodiment, the pixel defining layer may further include at least one third valley region and at least one third non-valley region disposed on a third virtual line completely enclosing the third pixel opening. The at least one third non-valley region may not face the at least one first non-valley region and the at least one second non-valley region. Each of a shortest distance between the at least one third non-valley region and the at least one first non-valley region and a shortest distance between the at least one third non-valley region and the at least one second non-valley region may be about 10 micrometers or more.

In an embodiment, the pixel defining layer may include a third non-valley region completely enclosing the third pixel opening.

In an embodiment, a first valley pattern corresponding to the at least one first valley region and a second valley pattern corresponding to the at least one second valley region may be defined in the pixel defining layer. Each of the first and second valley patterns may be defined as being recessed along a thickness direction of the pixel defining layer from an upper surface of the pixel defining layer.

In an embodiment, the display panel may further include first electrodes disposed on the base layer, at least partially covered by the pixel defining layer, and respectively overlapping the first and second pixel regions. A first angle formed between the upper surface of each of the first electrodes and an outer side surface of the pixel defining layer may be different from a second angle formed between the upper surface of each of the first electrodes and an inner side surface of the pixel defining layer defining the first valley pattern.

In an embodiment, the second angle may be about 70 degrees to about 90 degrees.

In an embodiment, a thickness of a portion of the light-emitting portion disposed on an inner side surface of the pixel defining layer defining the first valley pattern is smaller than a thickness of a portion of the light-emitting portion disposed on the upper surface of the pixel defining layer.

In an embodiment, the display panel may further include a second electrode overlapping the first and second pixel regions and disposed on the light-emitting portion. A first thickness of a portion of the second electrode disposed on the upper surface of the pixel defining layer may be different from a second thickness of a portion of the second electrode disposed on an inner side surface of the pixel defining layer defining the first valley pattern.

In an embodiment, the second thickness may be about 0.125 times to about 0.25 times the first thickness.

In an embodiment, the display panel may further include a dummy pattern disposed on the upper surface of the pixel defining layer and having first and second dummy openings defined in the dummy pattern and respectively corresponding to the at least one first valley region and the at least one second valley region. A lower surface of the dummy pattern overlapping the at least one first valley region and connected to an inner side surface of the dummy pattern defining the first dummy opening may be uncovered by the pixel defining layer. A portion of the light-emitting portion disposed on the upper surface of the pixel defining layer and a portion of the light-emitting portion disposed in the first valley pattern may not be connected to each other.

In an embodiment, the display panel may further include: first electrodes disposed on the base layer and respectively overlapping the first and second pixel regions; and a second electrode overlapping the first and second pixel regions and disposed on the light-emitting portion. The light-emitting portion may further include a first light-emitting layer disposed between the first electrodes and the charge generation layer; and a second light-emitting layer disposed between a charge generation layer and the second electrode.

In an embodiment, the light-emitting portion may further include: a hole control layer disposed between the first electrodes and the first light-emitting layer; and an electron control layer disposed between the first light-emitting layer and the charge generation layer.

In an embodiment of the inventive concept, a display panel includes: a base layer; a pixel defining layer; and a light-emitting portion. The base layer includes a first pixel region, (2-1)-th and (2-2)-th pixel regions at least partially spaced apart from each other in a first direction with the first pixel region interposed between the (2-1)-th and (2-2)-th pixel regions, and a non-pixel region adjacent to the first pixel region and the (2-1)-th and (2-2)-th pixel regions. The pixel defining layer is disposed on the base layer and has a first pixel opening defined in the pixel defining layer and corresponding to the first pixel region and (2-1)-th and (2-2)-th pixel openings defined in the pixel defining layer and respectively corresponding to the (2-1)-th and (2-2)-th pixel regions. The light-emitting portion overlaps the first pixel region and the (2-1)-th and (2-2)-th pixel regions, is disposed on the pixel defining layer, and includes a charge generation layer. The pixel defining layer includes at least one first valley region and at least one first non-valley region disposed on a first virtual line completely enclosing the first pixel opening; at least one first group valley region and at least one first group non-valley region disposed on a (2-1)-th virtual line completely enclosing the (2-1)-th pixel opening; and at least one second group valley region and at least one second group non-valley region disposed on a (2-2)-th virtual line completely enclosing the (2-2)-th pixel opening. The at least one first group non-valley region and the at least one second group non-valley region are not disposed on a same line in the first direction, and on a plane, the at least one first valley region is asymmetric with respect to a reference line passing through a center of the first pixel region and extending in a second direction perpendicular to the first direction.

BRIEF DESCRIPTION OF THE FIGURES

The accompanying drawings are included to provide a further understanding of the inventive concept, and are incorporated in and constitute a portion of this specification. The drawings illustrate embodiments of the inventive concept and, together with the description, serve to explain principles of the inventive concept.

FIGS. 6A and 6B are enlarged cross-sectional views of a portion of the display panel according to an embodiment of the inventive concept.

DETAILED DESCRIPTION

Figure 1:
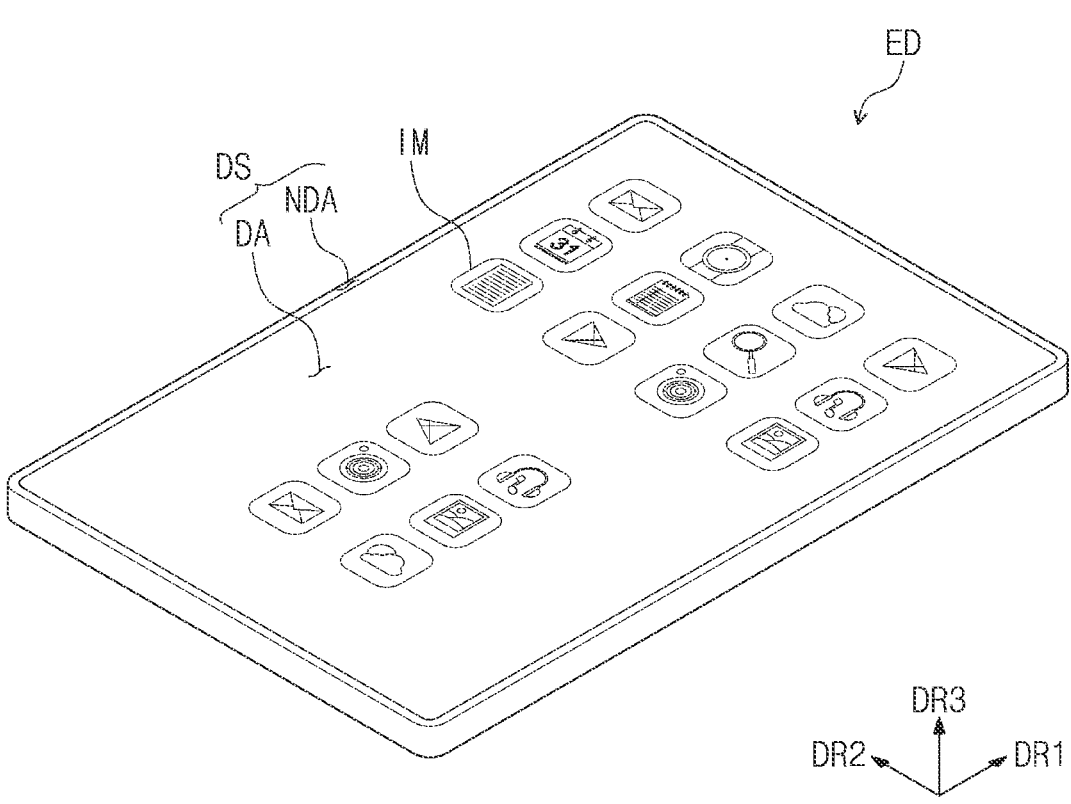
FIG. 1 is a combined perspective view of an electronic device according to an embodiment of the inventive concept.

In this specification, it will be understood that when an element (or region, layer, portion, etc.) is referred to as being "on", "connected to" or "coupled to" another element, it can be directly on, connected or coupled to the other element, or intervening elements may be present.

Like reference numerals refer to like elements throughout. In addition, in the drawings, the thicknesses, ratios, and dimensions of elements are exaggerated for effective description of the technical contents. As used herein, the term "and/or" includes any and all combinations that the associated configurations can define.

It will be understood that, although the terms first, second, etc. may be used herein to describe various elements, these elements should not be limited by these terms. These terms are only used to distinguish one element from another element. For example, a first element could be termed a second element without departing from the scope of the inventive concept. Similarly, the second element may also be referred to as the first element. The terms of a singular form include plural forms unless otherwise clearly specified.

In addition, terms, such as "below", "lower", "above", "upper" and the like, are used herein for ease of description to describe one element's relation to another element(s) as illustrated in the figures. The above terms are relative concepts and are described based on the directions indicated in the drawings.

It will be understood that the terms "include" and/or "have", when used in this specification, specify the presence of stated features, integers, steps, operations, elements, components and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described with reference to the drawings.

Figure 2:
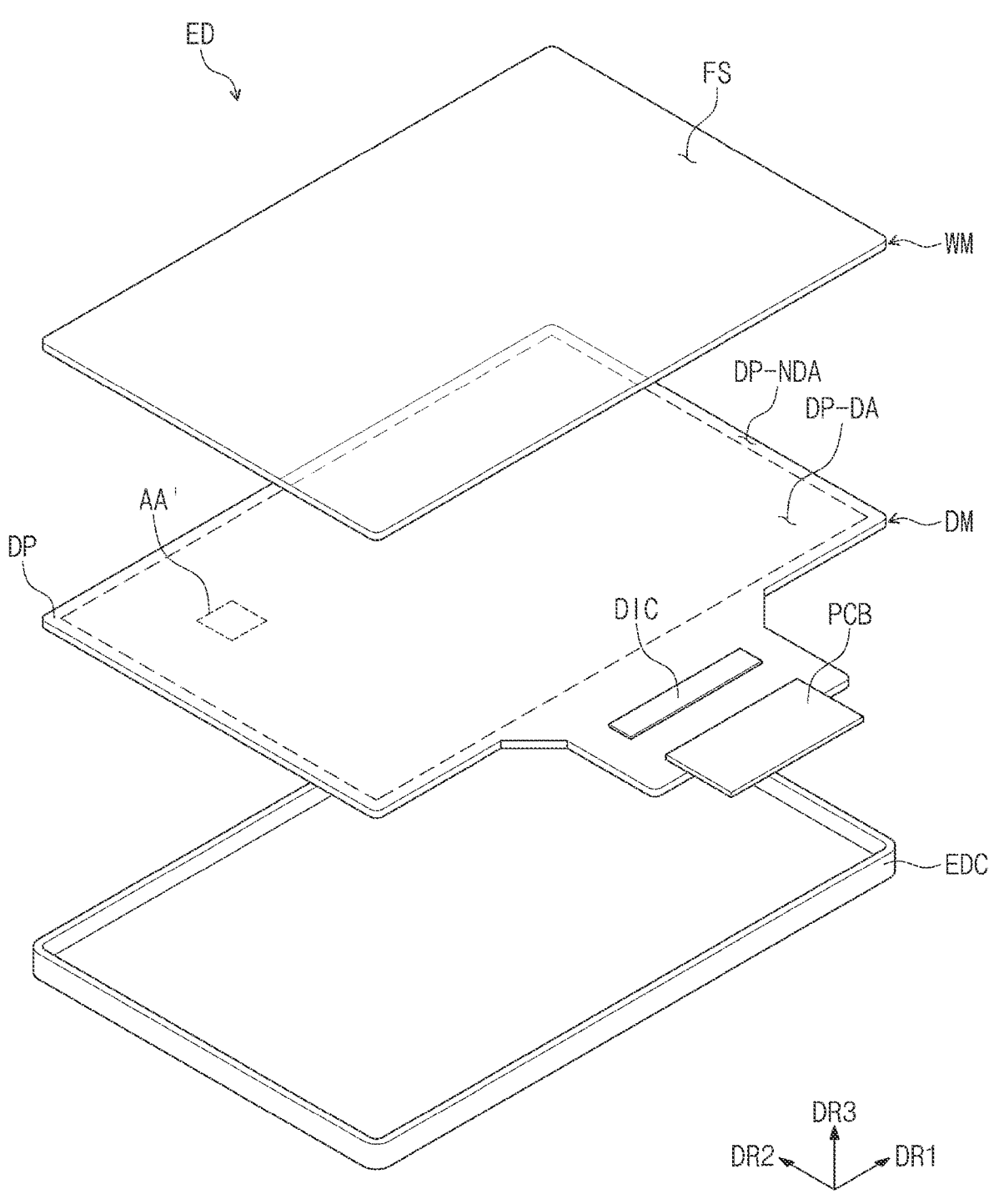
FIG. 2 is an exploded perspective view of the electronic device according to an embodiment of the inventive concept.

FIG. 1 is a combined perspective view of an electronic device ED according to an embodiment of the inventive concept. FIG. 2 is an exploded perspective view of the electronic device ED according to an embodiment of the inventive concept.

Referring to FIG. 1, the electronic device ED may be activated according to an electrical signal. The electronic device ED may display an image IM and sense an external input. The electronic device ED may include various embodiments. For example, the electronic device ED may include a tablet computer, a laptop, a computer, a smart phone, a television, and the like. In this embodiment, the electronic device ED is exemplarily illustrated as a tablet computer. Without being limited thereto, however, the electronic device according to an embodiment of the inventive concept may be a smart phone or a large display device such as a laptop computer, a monitor, or a television.

The electronic device ED may display the image IM in a third direction DR3 on a display surface DS parallel to each of a first direction DR1 and a second direction DR2. The display surface DS on which the image IM is displayed may correspond to a front surface of the electronic device ED and a front surface FS of a window WM, e.g., see FIG. 2, as well. Hereinafter, a same reference numeral will be used for the display surface, the front surface of the electronic device ED, and the front surface of the window WM. The image IM may include a still image as well as a dynamic image. FIG. 1 illustrates a plurality of icons as an example of the image IM.

In this embodiment, the front (or upper) surface and rear (or lower) surface of each member are defined based on a direction in which the image IM is displayed. The front surface and the rear surface may be opposed to each other in the third direction DR3, and a normal direction of each of the front surface and the rear surface may be parallel to the third direction DR3. A separation distance between the front and rear surfaces in the third direction DR3 may correspond to the thickness of the electronic device ED in the third direction DR3. Meanwhile, directions indicated by the first to third directions DR1, DR2, and DR3 are relative concepts and may be converted into other directions. Hereinafter, the first to third directions refer to the same reference numerals as directions indicated by the first to third directions DR1, DR2, and DR3, respectively. In addition, the expression "on a plane" in this specification may mean a state of being viewed on a plane defined by the first direction DR1 and the second direction DR2.

The electronic device ED according to an embodiment of the inventive concept may sense a user's input applied from the outside. The user's input includes various types of external inputs such as a portion of the user's body, light, heat, or pressure. The user's input may be provided in various forms, and the electronic device ED may sense the user's input applied to a side or rear surface of the electronic device ED according to the structure of the electronic device ED. The inventive concept is not limited to any one embodiment.

As illustrated in FIG. 2, the electronic device ED includes the window WM, a display module DM, and an outer case EDC. In this embodiment, the window WM and the outer case EDC are coupled to each other to form the exterior of the electronic device ED. In this embodiment, the outer case EDC, the display module DM, and the window WM may be sequentially stacked along the third direction DR3.

The window WM may contain an optically transparent material. The window WM may include an insulating panel. For example, the window WM may be composed of glass, plastic, or a combination of glass and plastic.

As described above, the front surface FS of the window WM defines the front surface of the electronic device ED.

The window WM may include a bezel region and a transmission region. The transmission region may be an optically transparent region. For example, the transmission region may have a visible light transmittance of about 90% or more.

The bezel region may have a relatively low light transmittance compared to the transmission region. The bezel region defines the shape of the transmission region. The bezel region may be adjacent to and enclose the transmission region. The bezel region may have a predetermined color. The bezel region may overlap a non-display region DP-NDA of a display panel DP, which will be described later. The bezel region may cover the non-display region DP-NDA of the display panel DP to block the non-display region DP-NDA from being viewed from the outside. Meanwhile, this has been described as an example, and in the window WM according to an embodiment of the inventive concept, the bezel region may be omitted.

The display module DM may include at least a display panel DP. FIG. 2 illustrates only the display panel DP among the stacked structure of the display module DM, but the display module DM may further include a plurality of elements disposed above and below the display panel DP. A detailed description of the stacked structure of the display module DM will be given later.

The display panel DP has a display region DP-DA and the non-display region DP-NDA which correspond to a display region DA (see FIG. 1) and a non-display region NDA (see FIG. 1) of the electronic device ED. In this specification, the expression "a region/portion corresponds to another region/portion" means that they overlap each other, but the expression is not limited to having a same area. The display module DM may include a driving chip DIC disposed on the non-display region DP-NDA. The display module DM may further include a printed circuit board PCB coupled to the non-display region DP-NDA. The printed circuit board PCB may be electrically connected to pads disposed in the non-display region DP-NDA of the display panel DP by an anisotropic conductive adhesive layer.

The driving chip DIC may include driving elements configured to drive pixels of the display panel DP, for example, a data driving circuit. Although FIG. 2 illustrates a structure in which the driving chip DIC is mounted on the display panel DP, the inventive concept is not limited thereto. For example, the driving chip DIC may be mounted on the printed circuit board PCB.

The outer case EDC may accommodate the display module DM and be coupled to the window WM. The outer case EDC may protect elements accommodated in the outer case EDC, such as the display module DM.

Figure 3A:
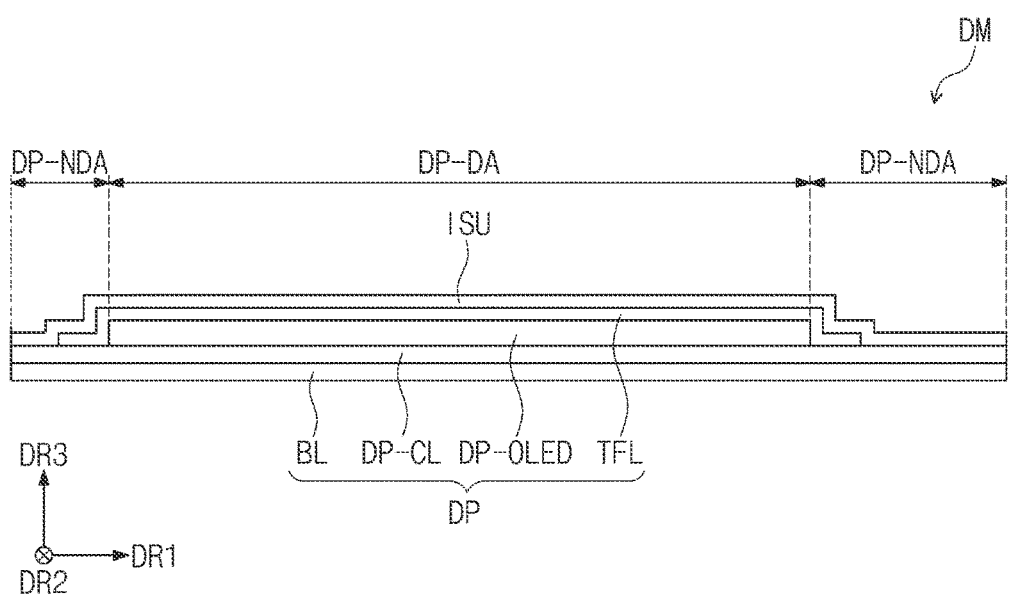
FIG. 3A is a cross-sectional view of a display module according to an embodiment of the inventive concept.
Figure 3B:
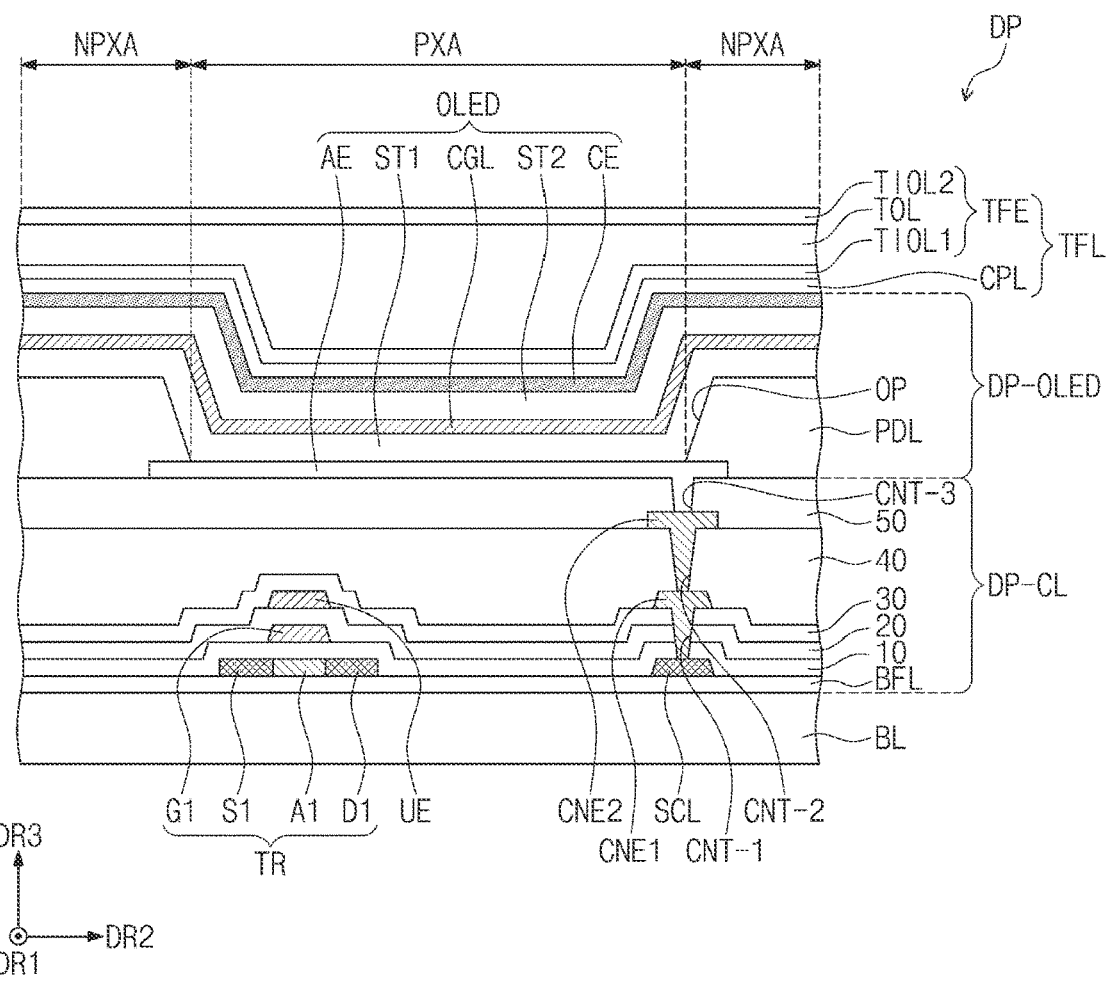
FIG. 3B is an enlarged cross-sectional view of a portion of a display panel according to an embodiment of the inventive concept.
Figure 3C:
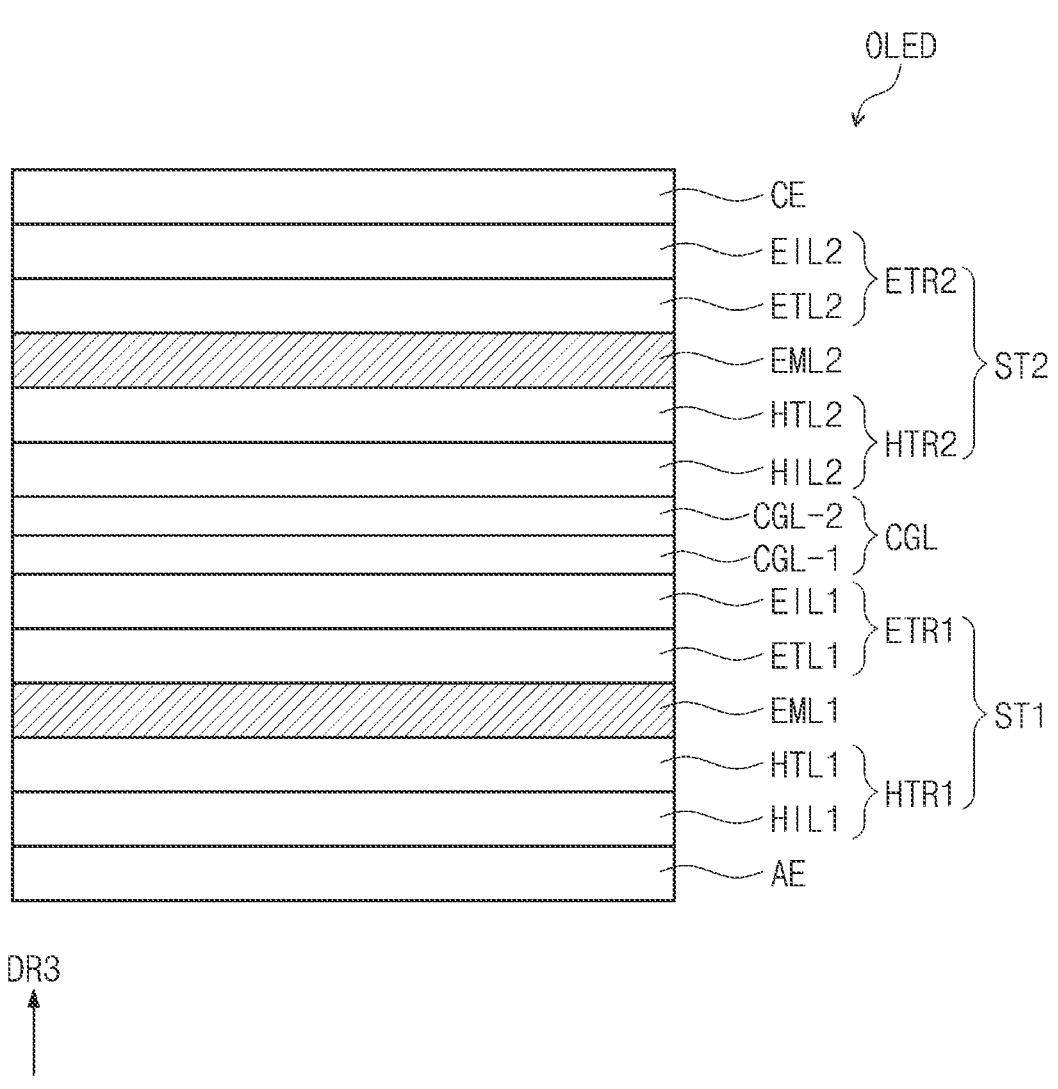
FIGS. 3C and 3D are enlarged cross-sectional views of a portion of a light-emitting element according to an embodiment of the inventive concept.
Figure 3D:
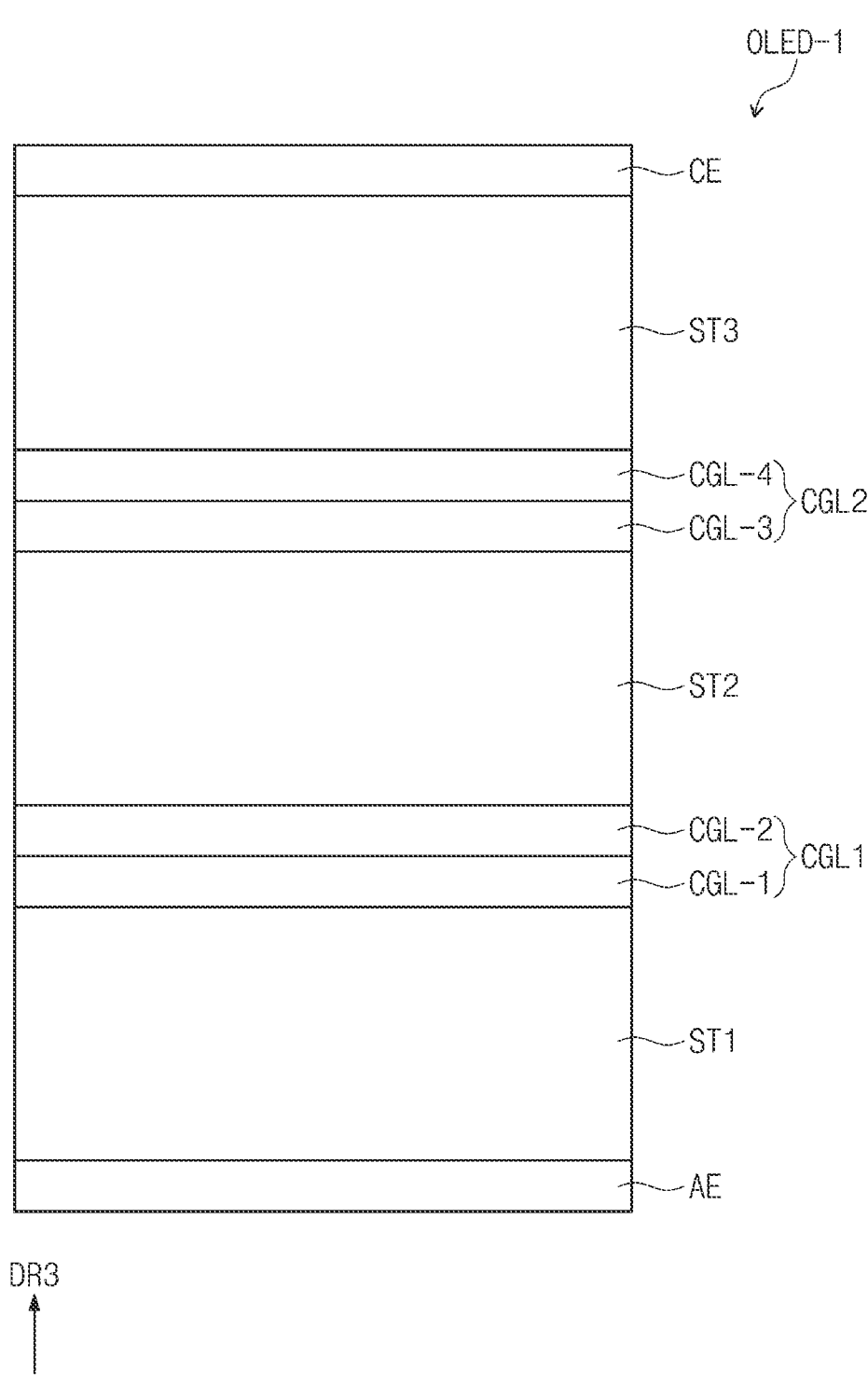

FIG. 3A is a cross-sectional view of a display module DM according to an embodiment of the inventive concept. FIG. 3B is an enlarged cross-sectional view of a portion of a display panel DP according to an embodiment of the inventive concept. FIGS. 3C and 3D are enlarged cross-sectional views of a portion of a light-emitting element according to an embodiment of the inventive concept. FIG. 3B exemplarily illustrates a light-emitting element OLED and a transistor TR included in a pixel included in the display panel DP according to an embodiment of the inventive concept.

Referring to FIG. 3A, the display module DM may include a display panel DP and an input sensing unit ISU. The display panel DP may be configured to substantially generate an image IM (see FIG. 1). The image IM (see FIG. 1) generated by the display panel DP may be viewed by a user from the outside through the display region DA (see FIG. 1).

The display panel DP may be a light-emitting display panel and is not particularly limited thereto. For example, the display panel DP may be an organic light-emitting display panel or an inorganic light-emitting display panel. The organic light-emitting display panel may be a display panel in which a light-emitting layer contains an organic light-emitting material. The inorganic light-emitting display panel may be a display panel in which a light-emitting layer contains quantum dots, quantum rods, or micro-LEDs. Hereinafter, the display panel DP will be described as an organic light-emitting display panel.

The input sensing unit ISU may be disposed on the display panel DP. The input sensing unit ISU may sense an external input applied from the outside. The external input may include various types of inputs provided from the outside of the electronic device ED (see FIG. 1). The external input may be provided in various forms. For example, the external input includes not only a touch by a portion of a user's body such as the user's hand, but also an external input (e.g., hovering) applied at a place close to or at a predetermined adjacent distance from the electronic device ED (see FIG. 1). In addition, the external input may have various forms such as force, pressure, and light and is not limited to any one embodiment.

The input sensing unit ISU may be formed on the display panel DP through a continuous process. In this case, the input sensing unit ISU may be disposed directly on the display panel DP. Meanwhile, in this specification, the expression "Component B is disposed directly on component A" may mean that a third component is not disposed between components A and B. For example, an adhesive layer may not be disposed between the input sensing unit ISU and the display panel DP.

The display panel DP may include a base layer BL, a circuit element layer DP-CL disposed on the base layer BL, a display element layer DP-OLED, and an upper insulating layer TFL.

The base layer BL may provide a base surface on which the circuit element layer DP-CL, the display element layer DP-OLED, and the upper insulating layer TFL are disposed. The base layer BL may be a rigid substrate or a flexible substrate capable of being bent, folded, or rolled. The base layer BL may be a glass substrate, a metal substrate, or a polymer substrate. However, the embodiment of the inventive concept is not limited thereto, and the base layer BL may include an inorganic layer, an organic layer, or a composite material layer.

The base layer BL may have a multi-layered structure. For example, the base layer BL may include a first synthetic resin layer, a multi-layered or single-layered inorganic layer, and a second synthetic resin layer disposed on the multi-layered or single-layered inorganic layer. Each of the first and second synthetic resin layers may contain a polyimide-based resin and is not particularly limited thereto.

The circuit element layer DP-CL may be disposed on the base layer BL. The circuit element layer DP-CL may include a plurality of insulating layers, a plurality of conductive layers, and a semiconductor layer. The plurality of conductive layers of the circuit element layer DP-CL may constitute signal lines or a control circuit of a pixel.

The display element layer DP-OLED may be disposed on the circuit element layer DP-CL. The display element layer DP-OLED may include light-emitting elements. The display element layer DP-OLED may include, for example, organic light-emitting elements. However, this is exemplary and the display element layer DP-OLED according to an embodiment of the inventive concept may include inorganic light-emitting elements, organic-inorganic light-emitting elements, or a liquid crystal layer.

The upper insulating layer TFL may include a capping layer and a thin film encapsulation layer, which will be described later. The upper insulating layer TFL may include an organic layer and a plurality of inorganic layers configured to seal the organic layer.

The upper insulating layer TFL may be disposed on the display element layer DP-OLED to protect the display element layer DP-OLED from moisture, oxygen, and foreign substances such as dust particles. The upper insulating layer TFL may seal the display element layer DP-OLED so as to block moisture and oxygen from entering the display element layer DP-OLED. The upper insulating layer TFL may include at least one inorganic layer. The upper insulating layer TFL may include an organic layer and a plurality of inorganic layers configured to seal the organic layer. The upper insulating layer TFL may include a structure in which an inorganic layer, an organic layer, and an inorganic layer are stacked in the order named.

The input sensing unit ISU is disposed on the upper insulating layer TFL. The input sensing unit ISU may be formed on the upper insulating layer TFL through a continuous process. The input sensing unit ISU may be disposed directly on the display panel DP. That is, a separate adhesive member may not be disposed between the input sensing unit ISU and the display panel DP. The input sensing unit ISU may be disposed to come in contact with an inorganic layer disposed at the very top of the upper insulating layer TFL.

Although not separately illustrated, the display module DM according to an embodiment of the inventive concept may further include a protective member disposed on the lower surface of the display panel DP and an anti-reflection member disposed on the upper surface of the input sensing unit ISU. The anti-reflection member may reduce the reflectance of external light. The anti-reflection member may be disposed directly on the input sensing unit ISU through a continuous process.

The anti-reflection member may include a light blocking pattern overlapping a reflective structure disposed below the anti-reflection member. The anti-reflection member may further include a color filter. The color filter may be disposed between light blocking patterns and may include a first color filter, a second color filter, and a third color filter corresponding to a first color pixel, a second color pixel, and a third color pixel.

As illustrated in FIG. 3A, the display panel DP may be divided into a display region DP-DA and a non-display region DP-NDA on a plane. The display region DP-DA of the display panel DP may be a region in which an image is displayed, and the non-display region DP-NDA of the display panel DP may be a region in which a driving circuit, a driving line, or the like is disposed. Light-emitting elements of each of a plurality of pixels may be disposed in the display region DP-DA. The display region DP-DA may overlap at least a portion of the transmission region of the window WM (see FIG. 2), and the non-display region DP-NDA may be covered by the bezel region of the window WM. The display region DP-DA and the non-display region DP-NDA of the display panel DP may respectively correspond to the display region DA and the non-display region NDA of the electronic device ED illustrated in FIG. 1.

Hereinafter, the configurations of the circuit element layer DP-CL, the display element layer DP-OLED, and the upper insulating layer TFL will be described in detail with reference to FIGS. 3B and 3C.

Referring to FIG. 3B, the circuit element layer DP-CL includes at least one insulating layer and one circuit element. The circuit element includes a signal line, a pixel driving circuit, and the like. The circuit element layer DP-CL may be formed through a process of forming an insulating layer, a semiconductor layer, and a conductive layer by coating, deposition, or the like and a process of patterning the insulating layer, the semiconductor layer, and the conductive layer by a photolithography process.

A buffer layer BFL may include at least one stacked inorganic layer. A semiconductor pattern is disposed on the buffer layer BFL. The buffer layer BFL improves bonding strength between the base layer BL and the semiconductor pattern.

The semiconductor pattern may contain polysilicon. Without being limited thereto, however, the semiconductor pattern may contain amorphous silicon or metal oxide. FIG. 3B illustrates only a portion of the semiconductor pattern, and the semiconductor pattern may be further disposed in other regions of the pixels on a plane. The semiconductor pattern may be arranged in a specific rule across the pixels.

The semiconductor pattern has different electrical properties depending on whether it is doped or not. The semiconductor pattern may include a first region A1 having low doping concentration and conductivity and second regions S1 and D1 having relatively high doping concentration and conductivity. One second region S1 may be disposed on one side of the first region A1, and the other second region D1 may be disposed on the other side of the first region A1. The second regions S1 and D1 may be doped with an N-type dopant or a P-type dopant. A P-type transistor includes a doped region doped with a P-type dopant. The first region A1 may be a non-doped region or may be doped at a lower concentration than the second regions S1 and D1.

The second regions S1 and D1 substantially serve as electrodes or signal lines. One second region S1 may correspond to a source of a transistor and one second region D1 may correspond to a drain of the transistor. FIG. 3B illustrates a portion of a connection signal line SCL formed from a semiconductor pattern. Although not separately illustrated, the connection signal line SCL may be connected to the drain of the transistor TR on a plane.

A first insulating layer 10 may be disposed on the buffer layer BFL. The first insulating layer 10 commonly overlaps a plurality of pixels disposed in the display region DP-DA and covers the semiconductor pattern. The first insulating layer 10 may be an inorganic layer and/or an organic layer and have a single-layered or multi-layered structure. The first insulating layer 10 may contain at least one of aluminum oxide, titanium oxide, silicon oxide, silicon oxynitride, zirconium oxide, or hafnium oxide. In addition to the first insulating layer 10, an insulating layer of the circuit element layer DP-CL to be described later may be an inorganic layer and/or an organic layer and have a single-layered or multi-layered structure.

A gate G1 is disposed on the first insulating layer 10. The gate G1 may be a portion of a metal pattern. The gate G1 overlaps the first region A1. In a process of doping the semiconductor pattern, the gate G1 may function as a mask.

A second insulating layer 20 may be disposed on the first insulating layer 10 and cover the gate G1. The second insulating layer 20 commonly overlaps the pixels. An upper electrode UE may be disposed on the second insulating layer 20. The upper electrode UE may overlap the gate G1. The upper electrode UE may include multiple metal layers. In an embodiment of the inventive concept, the upper electrode UE may be omitted.

A third insulating layer 30 may be disposed on the second insulating layer 20 and cover the upper electrode UE. A first connection electrode CNE1 may be disposed on the third insulating layer 30. The first connection electrode CNE1 may be connected to the connection signal line SCL through a contact hole CNT-1 passing through the first to third insulating layers 10 to 30.

A fourth insulating layer 40 may be disposed on the third insulating layer 30, and a fifth insulating layer 50 may be disposed on the fourth insulating layer 40. The fourth insulating layer 40 may be an organic layer. A second connection electrode CNE2 may be disposed on the fourth insulating layer 40. The second connection electrode CNE2 may be connected to the first connection electrode CNE1 through a contact hole CNT-2 passing through the fourth insulating layer 40.

The fifth insulating layer 50 may be disposed on the fourth insulating layer 40 and cover the second connection electrode CNE2. The fifth insulating layer 50 may be an organic layer.

The light-emitting element OLED may be disposed on the fifth insulating layer 50. A first electrode AE may be disposed on the fifth insulating layer 50. The first electrode AE is connected to the second connection electrode CNE2 through a contact hole CNT-3 passing through the fifth insulating layer 50. A pixel opening OP is defined in a pixel defining layer PDL, and the pixel defining layer PDL exposes at least a portion of the first electrode AE, i.e., the pixel opening OP extends to at least a portion of the first electrode AE. The pixel defining layer PDL may be an organic layer.

The display region DP-DA may include a pixel region PXA and a non-pixel region NPXA adjacent to the pixel region PXA. The non-pixel region NPXA may enclose the pixel region PXA. In this embodiment, the pixel region PXA is defined to correspond to a partial region of the first electrode AE exposed by the pixel opening OP.

Referring to FIG. 3C, the light-emitting element OLED may include a first electrode AE, a first light-emitting stack ST1, a charge generation layer CGL, a second light-emitting stack ST2, and a second electrode CE sequentially stacked in the third direction DR3. The light-emitting element OLED may have a tandem structure which includes a plurality of light-emitting stacks ST1 and ST2 including light-emitting layers.

The first light-emitting stack ST1 may include a first light-emitting layer EML1, and a first hole control layer HTR1 and a first electron control layer ETR1 which are disposed with the first light-emitting layer EML1 interposed between the first hole control layer HTR1 and the first electron control layer ETR1.

The first hole control layer HTR1 may include at least one of a first hole injection layer HIL1 or a first hole transport layer HTL1. The first hole transport layer HTL1 may include at least one of a first hole buffer layer or a first electron blocking layer.

The first electron control layer ETR1 may include at least one of a first electron injection layer EIL1 or a first electron transport layer ETL1. The first electron control layer ETR1 may further include a first hole blocking layer.

The second light-emitting stack ST2 may include a second light-emitting layer EML2, and a second hole control layer HRT2 and a second electron control layer ETR2 which are disposed with the second light-emitting layer EML2 interposed between the second hole control layer HRT2 and the second electron control layer ETR2.

The second hole control layer HTR2 may include at least one of a second hole injection layer HIL2 or a second hole transport layer HTL2. The second electron control layer ETR2 may include at least one of a second electron injection layer EIL2 or a second electron transport layer ETL2. The descriptions of the first hole control layer HTR1 and the first electron control layer ETR1 may be equally applied to the descriptions of the second hole control layer HTR2 and the second electron control layer ETR2.

In an embodiment of the inventive concept, light emitted from each of the light-emitting stacks ST1 and ST2 may all have a same wavelength. For example, the light emitted from each of the light-emitting stacks ST1 and ST2 may be blue light. However, the embodiment of the inventive concept is not limited thereto, and the wavelength ranges of light emitted from the light-emitting stacks ST1 and ST2 may be different from each other. For example, at least one of the light-emitting stacks ST1 and ST2 may emit blue light and the other of the at least one of the light-emitting stacks ST1 and ST2 may emit green light. The light-emitting element OLED including the light-emitting stacks ST1 and ST2 configured to emit light having different wavelength ranges may emit white light.

The charge generation layer CGL may be disposed between the first light-emitting stack ST1 and the second light-emitting stack ST2. When a voltage is applied to the charge generation layer CGL, charges (electrons and holes) may be generated by forming a complex through an oxidation-reduction reaction. In addition, the charge generation layer CGL may provide the generated charges to each of the light-emitting stacks ST1 and ST2. The charge generation layer CGL may double the efficiency of current generated in each of the light-emitting stacks ST1 and ST2 and play a role in controlling the balance of charges between the first light-emitting stack ST1 and the second light-emitting stack ST2.

More specifically, the charge generation layer CGL may have a layer structure in which a lower charge generation layer CGL-1 and an upper charge generation layer CGL-2 are bonded to each other. The lower charge generation layer CGL-1 may be an n-type charge generation layer which is disposed adjacent to the first light-emitting stack ST1 and provides electrons to the first light-emitting stack ST1. The lower charge generation layer CGL-1 may contain an arylamine-based organic compound.

The upper charge generation layer CGL-2 may be a p-type charge generation layer which is disposed adjacent to the second light-emitting stack ST2 and provides holes to the second light-emitting stack ST2. The upper charge generation layer CGL-2 may contain a charge generating compound composed of a metal, an oxide of a metal, a carbide, a fluoride, or a mixture thereof.

A buffer layer may be further disposed between the lower charge generation layer CGL-1 and the upper charge generation layer CGL-2.

According to this embodiment, the first light-emitting stack ST1, the charge generation layer CGL, and the second light-emitting stack ST2 may be commonly formed in a plurality of pixels by using an open mask. Without being limited thereto, however, at least one of the first and second hole control layers HTR1 and HTR2, the first and second light-emitting layers EML1 and EML2, or the first and second electron control layers ETR1 and ETR2 may be formed by being patterned with the use of a mask. For example, each of the first and second light-emitting layers EML1 and EML2 may be disposed in a region corresponding to the pixel opening OP. That is, each of the first and second light-emitting layers EML1 and EML2 may be formed separately in each of the pixels.

The second electrode CE may be disposed on the second light-emitting stack ST2. The second electrode CE may have an integral shape and be commonly disposed in a plurality of pixels.

Referring to FIG. 3B again, the upper insulating layer TFL may be disposed on the display element layer DP-OLED and include a plurality of thin films. According to an embodiment of the inventive concept, the upper insulating layer TFL may include a capping layer CPL and an encapsulation layer TFE disposed on the capping layer CPL. The capping layer CPL is disposed on and comes in contact with the second electrode CE. The capping layer CPL may contain an organic material.

The encapsulation layer TFE may include a first inorganic encapsulation layer TIOL1, an organic encapsulation layer TOL disposed on the first inorganic encapsulation layer TIOL1, and a second inorganic encapsulation layer TIOL2 disposed on the organic encapsulation layer TOL. The first inorganic encapsulation layer TIOL1 and the second inorganic encapsulation layer TIOL2 protect the display element layer DP-OLED from moisture/oxygen, and the organic encapsulation layer TOL protects the display element layer DP-OLED from foreign substances such as dust particles.

Referring to FIG. 3D, a light-emitting element OLED-1 according to an embodiment of the inventive concept may include a first electrode AE, a first light-emitting stack ST1, a first charge generation layer CGL1, a second light-emitting stack ST2, a second charge generation layer CGL2, a third light-emitting stack ST3, and a second electrode CE which are sequentially stacked along the third direction DR3. That is, in this embodiment, the light-emitting element OLED-1 may include two charge generation layers CGL1 and CGL2 disposed between the three light-emitting stacks ST1, ST2, and ST3 and adjacent light-emitting stacks ST1, ST2, and ST3. Same/similar reference numerals will be used for the same/similar elements as those described in FIGS. 3B and 3C, and duplicate descriptions will be omitted.

The third light-emitting stack ST3 may have a structure similar to those of the first and second light-emitting stacks ST1 and ST2 described above with reference to FIG. 3C. The third light-emitting stack ST3 may include a third hole control layer, a third light-emitting layer, and a third electron control layer which are sequentially stacked on the second charge generation layer ETR2 (see FIG. 3C) along the third direction DR3.

In addition, each of the first and second charge generation layers CGL1 and CGL2 may have a structure similar to that of the charge generation layer CGL described above with reference to FIG. 3C. The first charge generation layer CGL1 may have a layer structure in which a first lower charge generation layer CGL-1 and a first upper charge generation layer CGL-2 are bonded to each other, and the second charge generation layer CGL2 may have a layer structure in which a second lower charge generation layer CGL-3 and a second upper charge generation layer CGL-4 are bonded to each other.

Meanwhile, the number of the light-emitting stacks ST1, ST2, and ST3 and the number of the charge generation layers CGL1 and CGL2 are not limited to those illustrated in FIGS. 3C and 3D, and the light-emitting element OLED-1 may include four or more light-emitting stacks and three or more charge generation layers.

Figure 4A:
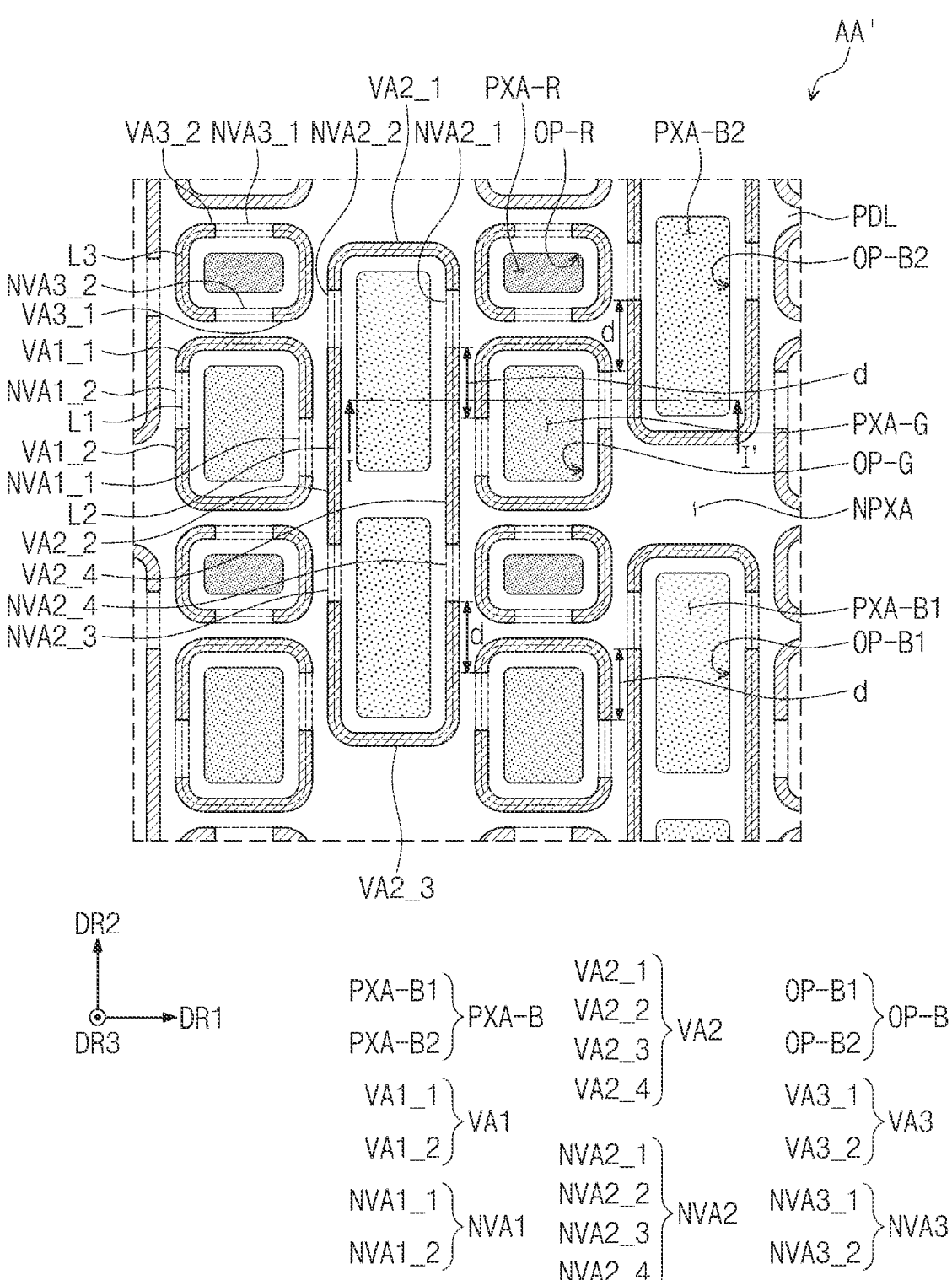
FIGS. 4A and 4B are enlarged plan views of a portion of the display panel according to an embodiment of the inventive concept.
Figure 4B:
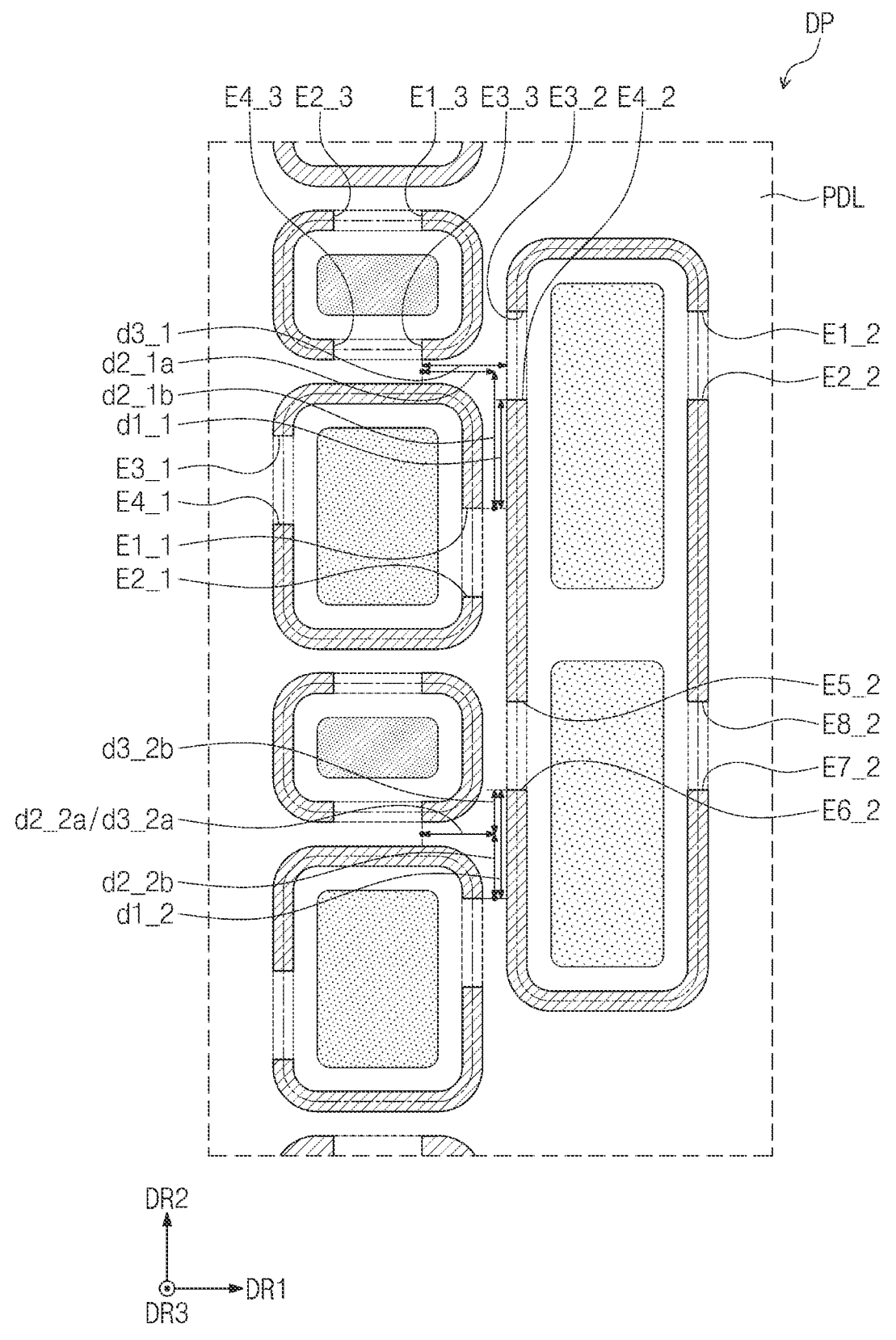

FIGS. 4A and 4B are enlarged plan views of a portion of the display panel according to an embodiment of the inventive concept. FIG. 4A illustrates an enlarged arrangement of a plurality of pixels, and valley regions VA1, VA2, and VA3 and non-valley regions NVA1, NVA2, and NVA3 defined adjacent to the plurality of pixels, which are included in region AA' of the display panel DP illustrated in FIG. 2. FIG. 4B illustrates an enlarged portion of the display panel DP (see FIG. 2) corresponding to a portion of the region AA' illustrated in FIG. 4A.

Referring to FIGS. 4A and 4B, in the display module DM (see FIG. 2) according to an embodiment of the inventive concept, the display region DP-DA (see FIG. 2) may include pixel regions PXA-G, PXA-B, and PXA-R, and a non-pixel region NPXA enclosing the pixel regions PXA-G, PXA-B, and PXA-R. In this specification, the base layer BL (see FIG. 3A) of the display panel DP may be regarded as including the pixel regions PXA-G, PXA-B, and PXA-R and a non-pixel region NPXA, and the remaining elements of the display panel DP disposed on the base layer BL (see FIG. 3A) may be regarded as being disposed to overlap the pixel regions PXA-G, PXA-B, and PXA-R and/or the non-pixel region NPXA.

The pixel regions PXA-G, PXA-B, and PXA-R may include a first pixel region PXA-G, a second pixel region PXA-B, and a third pixel region PXA-R. Each of the first pixel region PXA-G, the second pixel region PXA-B, and the third pixel region PXA-R may display light having a different wavelength. The first pixel region PXA-G may display a first light having a green wavelength, the second pixel region PXA-B may display a second light having a blue wavelength, and the third pixel region PXA-R may display a third light having a red wavelength.

A plurality of first pixel regions PXA-G and a plurality of third pixel regions PXA-R may constitute a 'first pixel group' alternately arranged along the second direction DR2. A plurality of second pixel regions PXA-B may constitute a 'second pixel group' arranged along the second direction DR2. In this embodiment, the 'second pixel group' may include a plurality of sub-pixel groups, and each of the sub-pixel groups may include two second pixel regions PXA-B. The two second pixel regions PXA-B included in one sub-pixel group may be respectively referred to as a (2-1)-th pixel region PXA-B1 and a (2-2)-th pixel region PXA-B2.

A separation distance between the (2-1)-th pixel region PXA-B1 and the (2-2)-th pixel region PXA-B2 in one sub-pixel group may be smaller than a separation distance between the (2-1)-th pixel region PXA-B1 and the (2-2)-th pixel region PXA-B2 respectively disposed in sub-pixel groups adjacent to each other. By having the two second pixel regions PXA-B1 and PXA-B2 disposed adjacent to each other to form one sub-pixel group, it is possible to improve the yield of a process performed for the deposition of light-emitting portions EP (see FIG. 5) with the use of a fine metal mask (FMM).

Each of the first pixel group composed of the first and third pixel regions PXA-G and PXA-R and the second pixel group composed of the (2-1)-th and (2-2)-th pixel regions PXA-B1 and PXA-B2 is provided in plurality, wherein the plurality of first pixel groups and the plurality of second pixel groups may be alternately arranged along the first direction DR1.

Each of the pixel regions PXA-G, PXA-B, and PXA-R may be divided by the aforementioned pixel defining layer PDL. The non-pixel region NPXA may be a region between neighboring pixel regions PXA-G, PXA-B, and PXA-R and correspond to the pixel defining layer PDL.

In the pixel defining layer PDL, first pixel openings OP-G respectively corresponding to the first pixel regions PXA-G, second pixel openings OP-B respectively corresponding to the second pixel regions PXA-B, and third pixel openings OP-R respectively corresponding to the third pixel regions PXA-R may be defined. In this embodiment, the second pixel openings OP-B may include (2-1)-th pixel openings OP-B1 respectively corresponding to the (2-1)-th pixel regions PXA-B1 and (2-2)-th pixel openings OP-B2 respectively corresponding to the (2-2)-th pixel regions PXA-B2.

Each of the first pixel regions PXA-G may correspond to the first electrode AE (see FIG. 3B) exposed from the pixel defining layer PDL by a corresponding first pixel opening OP-G. Each of the (2-1)-th pixel regions PXA-B1 may correspond to the first electrode AE (see FIG. 3B) exposed from the pixel defining layer PDL by a corresponding (2-1)-th pixel opening OP-B1. Each of the (2-2)-th pixel regions PXA-B2 may correspond to the first electrode AE (see FIG. 3B) exposed from the pixel defining layer PDL by a corresponding (2-2)-th pixel opening OP-B2. Each of the third pixel regions PXA-R may correspond to the first electrode AE (see FIG. 3B) exposed from the pixel defining layer PDL by a corresponding third pixel opening OP-R.

The first to third pixel regions PXA-G, PXA-B, and PXA-R may have different areas according to the wavelength of emitted light. For example, the second pixel region PXA-B configured to emit a second light may have the largest area, and the third pixel region PXA-R configured to generate a third light may have the smallest area. However, the embodiment of the inventive concept is not limited thereto, and the first to third pixel regions PXA-G, PXA-B, and PXA-R may have a same area, or the first to third pixel regions PXA-G, PXA-B, and PXA-R may be defined to have an area ratio different from what is illustrated in FIG. 4A. Alternatively, the first to third pixel regions PXA-G, PXA-B, and PXA-R may emit light of a different color other than the light having a green wavelength, the light having a blue wavelength, and the light having a red wavelength which are described above.

Each of the first to third pixel regions PXA-G, PXA-B, and PXA-R may have a rectangular shape with rounded corners on a plane. In an embodiment of the inventive concept, each of the first pixel region PXA-G and the second pixel region P XA-B may have a rectangular shape with long sides extending in the second direction DR2 and short sides extending in the first direction DR1. The corners of each of the first pixel region PXA-G and the second pixel region PXA-B, at which long and short sides adjacent to each other are connected to each other, may have a rounded shape. In an embodiment of the inventive concept, the third pixel region PXA-R may have a rectangular shape with long sides extending in the first direction DR1 and short sides extending in the second direction DR2. The corners of the third pixel region PXA-R, at which long and short sides adjacent to each other are connected to each other, may have a rounded shape.

A first long side of the first pixel region PXA-G may be spaced apart from the center of the first pixel region PXA-G in the first direction DR1, and a second long side of the first pixel region PXA-G may be spaced apart from the center of the first pixel region PXA-G in a direction opposite to the first direction DR1. A first short side of the first pixel region PXA-G may be spaced apart from the center of the first pixel region PXA-G in the second direction DR2, and a second short side of the first pixel region PXA-G may be spaced apart from the center of the first pixel region PXA-G in a direction opposite to the second direction DR2. This may also be equally applied to first and second long sides and first and second short sides of each of the second pixel regions PXA-B (that is, the (2-1)-th and (2-2)-th pixel regions PXA-B1 and PXA-B2).

A first long side of the third pixel region PXA-R may be spaced apart from the center of the third pixel region PXA-R in the second direction DR2, and a second long side of the third pixel region PXA-R may be spaced apart from the center of the third pixel region PXA-R in a direction opposite to the second direction DR2. A first short side of the third pixel region PXA-R may be spaced apart from the center of the third pixel region PXA-R in the first direction DR1, and a second short side of the third pixel region PXA-R may be spaced apart from the center of the third pixel region PXA-R in a direction opposite to the first direction DR1.

In this embodiment, first virtual lines L1, second virtual lines L2, and third virtual lines L3 may be defined in the pixel defining layer PDL. Each of the first virtual lines L1 is defined as a line completely enclosing a corresponding first pixel opening OP-G. Each of the second virtual lines L2 is defined as a line completely enclosing a corresponding second pixel opening OP-B. Each of the third virtual lines L3 is defined as a line completely enclosing a corresponding third pixel opening OP-R.

The pixel defining layer PDL may include at least one first valley region VA1 and at least one first non-valley region NVA1 disposed on one first virtual line L1, at least one second valley region VA2 and at least one second non-valley region NVA2 disposed on one second virtual line L2, and at least one third valley region VA3 and at least one third non-valley region NVA3 disposed on one third virtual line L3.

In this embodiment, the first valley region VA1 may be provided in plurality on the one first virtual line L1, wherein the plurality of first valley regions VA1 may include a (1-1)-th valley region VA1_1 and a (1-2)-th valley region VA1_2. The (1-1)-th and (1-2)-th valley regions VA1_1 and VA1_2 may be spaced apart from each other.

In an embodiment of the inventive concept, the (1-1)-th valley region VA1_1 may enclose at least one of the first short side of a corresponding first pixel region PXA-G, a portion of the first long side of the corresponding first pixel region PXA-G adjacent to the first short side, or a portion of the second long side of the corresponding first pixel region PXA-G adjacent to the first short side. The (1-2)-th valley region VA1_2 may enclose at least one of the second short side of a corresponding first pixel region PXA-G, a portion of the first long side of the corresponding first pixel region PXA-G adjacent to the second short side, or a portion of the second long side of the corresponding first pixel region PXA-G adjacent to the second short side.

For example, as illustrated in FIG. 4A, when the (1-1)-th valley region VA1_1 encloses a portion of the first long side, the (1-2)-th valley region VA1_2 may enclose a portion of the second long side, and in contrast, when the (1-1)-th valley region VA1_1 encloses a portion of the second long side, the (1-2)-th valley region VA1_2 may enclose a portion of the first long side.

One end E1_1 of the (1-1)-th valley region VA1_1 and one end E2_1 of the (1-2)-th valley region VA1_2 may face each other in the second direction DR2. The other end E3_1 of the (1-1)-th valley region VA1_1 and the other end E4_1 of the (1-2)-th valley region VA1_2 may face each other in the second direction DR2.

In this embodiment, the first non-valley region NVA1 may be provided in plurality on one first virtual line L1, wherein the plurality of first non-valley regions NVA1 may include a (1-1)-th non-valley region NVA1_1 and a (1-2)-th non-valley region NVA1_2.

The (1-1)-th non-valley region NVA1_1 may be disposed between one end E1_1 of the (1-1)-th valley region VA1_1 and one end E2_1 of the (1-2)-th valley region VA1_2, and the (1-2)-th non-valley region NVA1_2 may be disposed between the other end E3_1 of the (1-1)-th valley region VA1_1 and the other end E4_1 of the (1-2)-th valley region VA1_2. Each of the (1-1)-th and (1-2)-th non-valley regions NVA1_1 and NVA1_2 may extend in the second direction DR2.

The (1-1)-th and (1-2)-th non-valley regions NVA1_1 and NVA1_2 may be respectively disposed adjacent to the first and second long sides of the first pixel region PXA-G. The (1-1)-th non-valley region NVA1_1 may be disposed to be spaced apart from the first pixel opening OP-G in the first direction DR1, and the (1-2)-th non-valley region NVA1_2 may be disposed to be spaced apart from the first pixel opening OP-G in a direction opposite to the first direction DR1.

In an embodiment of the inventive concept, when the (1-1)-th non-valley region NVA1_1 is disposed closer to the second short side of the first pixel region PXA-G than the first short side of the first pixel region PXA-G, the (1-2)-th non-valley region NVA1_2 may be disposed closer to the first short side of the first pixel region PXA-G than the second short side of the first pixel region PXA-G, and when the (1-1)-th non-valley region NVA1_1 is disposed closer to the first short side of the first pixel region PXA-G than the second short side of the first pixel region PXA-G, the (1-2)-th non-valley region NVA1_2 may be disposed closer to the second short side of the first pixel region PXA-G than the first short side of the first pixel region PXA-G.

In an embodiment of the inventive concept, the first valley regions VA1 and the first non-valley regions NVA1 respectively disposed on the first virtual lines L1 spaced apart from each other with the (2-1)-th pixel region PXA-B1 interposed therebetween may be disposed in line symmetry with each other. The first valley regions VA1 and the first non-valley regions NVA1 respectively disposed on the first virtual lines L1 spaced apart from each other with the (2-2)-th pixel region PXA-B2 interposed therebetween may be disposed in line symmetry with each other.

In this embodiment, the length of the (1-1)-th non-valley region NVA1_1 in the second direction DR2 may be substantially the same as the length of the (1-2)-th non-valley region NVA1_2 in the second direction DR2. In this case, the (1-1)-th non-valley region NVA1_1 and the (1-2)-th non-valley region NVA1_2 may not be disposed to completely face each other in the first direction DR1. In other words, at least a portion of the (1-1)-th non-valley region NVA1_1 may overlap the (1-2)-th valley region VA1_2 when viewed in the first direction DR1, and at least a portion of the (1-2)-th non-valley region NVA1_2 may overlap the (1-1)-th valley region VA1_1 when viewed in the first direction DR1.

In this embodiment, the second virtual line L2 may enclose all of the (2-1)-th and (2-2)-th pixel regions PXA-B1 and PXA-B2 constituting one sub-pixel group. The second virtual line L2 may not be defined between the (2-1)-th and (2-2)-th pixel regions PXA-B1 and PXA-B2 in one sub-pixel group.

In this embodiment, the second valley region VA2 may be provided in plurality on one second virtual line L2, wherein the plurality of second valley regions may include a (2-1)-th valley region VA2_1, a (2-2)-th valley region VA2_2, a (2-3)-th valley region VA2_3, and a (2-4)-th valley region VA2_4. The (2-1)-th to (2-4)-th valley regions VA2_1, VA2_2, VA2_3, and VA2_4 may be spaced apart from each other.

In an embodiment of the inventive concept, the (2-1)-th valley region VA2_1 may enclose the first short side of the (2-1)-th pixel region PXA-B1, a portion of the first long side of the (2-1)-th pixel region PXA-B1 adjacent to the first short side of the (2-1)-th pixel region PXA-B1, a portion of the second long side of the (2-1)-th pixel region PXA-B1 adjacent to the first short side of the (2-1)-th pixel region PXA-B1. The (2-2)-th valley region VA2_2 may enclose a portion of the second long side of the (2-1)-th pixel region PXA-B1 adjacent to the second short side of the (2-1)-th pixel region PXA-B1 and a portion of the second long side of the (2-2)-th pixel region PXA-B2 adjacent to the first short side of the (2-2)-th pixel region PXA-B2.

The (2-3)-th valley region VA2_3 may enclose the second short side of the (2-2)-th pixel region PXA-B2, a portion of the second long side of the (2-2)-th pixel region PXA-B2 adjacent to the second short side of the (2-2)-th pixel region PXA-B2, and a portion of the first long side of the (2-2)-th pixel region PXA-B2 adjacent to the second short side of the (2-2)-th pixel region PXA-B2. The (2-4)-th valley region VA2_4 may be disposed adjacent to a portion of the first long side of the (2-2)-th pixel region PXA-B2 adjacent to the first short side of the (2-2)-th pixel region PXA-B2 and a portion of the first long side of the (2-1)-th pixel region PXA-B1 adjacent to the second short side of the (2-1)-th pixel region PXA-B1.

All of one end E1_2 of the (2-1)-th valley region VA2_1 and one end E2_2 of the (2-4)-th valley region VA2_4, the other end E3_2 of the (2-1)-th valley region VA2_1 and one end (E4_2) of the (2-2)-th valley region VA2_2, the other end E5_2 of the (2-2)-th valley region VA2_2 and one end E6_2 of the (2-3)-th valley region (VA2_3), and the other end E7_2 of the (2-3)-th valley region VA2_3 and the other end E8_2 of the (2-4)-th valley region VA2_4 may face each other in the second direction DR2.

In this embodiment, the second non-valley region NVA2 may be provided in plurality on one second virtual line L2, wherein the plurality of second non-valley regions NVA2 may include a (2-1)-th non-valley region NVA2_1, a (2-2)-th non-valley region NVA2_2, a (2-3)-th non-valley region NVA2_3, and a (2-4)-th non-valley region NVA2_4.

The (2-1)-th non-valley region NVA2_1 may be disposed between one end E1_2 of the (2-1)-th valley region VA2_1 and one end E2_2 of the (2-4)-th valley region VA2_4, and the (2-2)-th non-valley region NVA2_2 may be disposed between the other end E3_2 of the (2-1)-th valley region VA2_1 and one end E4_2 of the (2-2)-th valley region VA2_2. The (2-3)-th non-valley region NVA2_3 may be disposed between the other end E5_2 of the (2-2)-th valley region VA2_2 and one end E6_2 of the (2-3)-th valley region VA2_3, and the (2-4)-th non-valley region NVA2_4 may be disposed between the other end E7_2 of the (2-3)-th valley region VA2_3 and the other end E8_2 of the (2-4)-th valley region VA2_4.

Each of the (2-1)-th to (2-4)-th non-valley regions NVA2_1, NVA2_2, NVA2_3, and NVA2_4 may extend in the second direction DR2. That is, in this embodiment, the second non-valley regions NVA2 may have the same extension direction as the first non-valley regions NVA1.

The (2-1)-th and (2-2)-th non-valley regions NVA2_1 and NVA2_2 may be disposed adjacent to the (2-1)-th pixel region PXA-B1, and the (2-3)-th and (2-4)-th non-valley regions NVA2_3 and NVA2_4 may be disposed adjacent to the (2-2)-th pixel region PXA-B2.

Specifically, the (2-1)-th and (2-2)-th non-valley regions NVA2_1 and NVA2_2 may be respectively disposed adjacent to the first and second long sides of the (2-1)-th pixel region PXA-B1. The (2-1)-th non-valley region NVA2_1 may be disposed to be spaced apart from the (2-1)-th pixel opening OP-B1 in the first direction DR1, and the (2-2)-th non-valley region NVA2_2 may be disposed to be spaced apart from the (2-2)-th pixel opening OP-B2 in a direction opposite to the first direction DR1.

The (2-3)-th and (2-4)-th non-valley regions NVA2_3 and NVA2_4 may be respectively disposed adjacent to the first and second long sides of the (2-2)-th pixel region PXA-B2. The (2-3)-th non-valley region NVA2_3 may be disposed to be spaced apart from the (2-2)-th pixel opening OP-B2 in a direction opposite to the first direction DR1, and the (2-4)-th non-valley region NVA2_4 may be disposed to be spaced apart from the (2-2)-th pixel opening OP-B2 in the first direction DR1.

In this embodiment, the length of the (2-1)-th non-valley region NVA2_1 in the second direction DR2 may be substantially the same as the length of the (2-2)-th non-valley region NVA2_2 in the second direction DR2. In this case, the (2-1)-th non-valley region NVA2_1 and the (2-2)-th non-valley region NVA2_2 may face each other in the first direction DR1. The (2-1)-th non-valley region NVA2_1 may be disposed to entirely overlap the (2-2)-th non-valley region NVA2_2 when viewed in the first direction DR1.

In addition, the length of the (2-3)-th non-valley region NVA2_3 in the second direction DR2 may be substantially the same as the length of the (2-4)-th non-valley region NVA2_4 in the second direction DR2. In this case, the (2-3)-th non-valley region NVA2_3 and the (2-4)-th non-valley region NVA2_4 may face each other in the first direction DR1. The (2-3)-th non-valley region NVA2_3 may be disposed to entirely overlap the (2-4)-th non-valley region NVA2_4 when viewed in the first direction DR1.

In this embodiment, each of the first pixel regions PXA-G may be disposed between any one (2-1)-th pixel region PXA-B1 of the second pixel group and any one adjacent (2-2)-th pixel region PXA-B2 of the second pixel group in the first direction DR1. The (2-1)-th pixel region PXA-B1 may be disposed closer to the second short side of an adjacent first pixel region PXA-G than the (2-2)-th pixel region PXA-B2.

In the (2-1)-th, first, and (2-2)-th pixel regions PXA-B1, PXA-G, and PXA-B2 sequentially arranged in the first direction DR1, the second virtual line L2 completely enclosing the (2-1)-th pixel opening OP-B1 corresponding to the (2-1)-th pixel region PXA-B1 may be defined as a '(2-1)-th virtual line', and the second virtual line L2 completely enclosing the (2-2)-th pixel opening OP-B2 corresponding to the (2-2)-th pixel region PXA-B2 may be defined as a '(2-2)-th virtual line'.

The second valley regions VA2 disposed on the (2-1)-th virtual line may be defined as 'at least one first group valley region', and the second non-valley regions NVA2 disposed on the (2-1)-th virtual line and adjacent to the (2-1)-th pixel region PXA-B1 may be defined as 'at least one first group non-valley region'.

The second valley regions VA2 disposed on the (2-2)-th virtual line may be defined as 'at least one second group valley region', and the second non-valley regions NVA2 disposed on the (2-2)-th virtual line and adjacent to the (2-2)-th pixel region PXA-B2 may be defined as 'at least one second group non-valley region'. In this case, the at least one first group non-valley region and the at least one second group non-valley region may not be disposed on the same line in the first direction DR1. Accordingly, the (1-1)-th and (1-2)-th non-valley regions NVA1_1 and NVA1_2 may also not be disposed on the same line in the first direction DR1. In other words, on a plane, the first valley regions VA1 and the first non-valley regions NVA1 may be asymmetric with each other with respect to a reference line passing through the center of the first pixel region PXA-G and extending in the second direction DR2.

In this embodiment, the third valley region VA3 may be provided in plurality on one third virtual line L3, wherein the plurality of third valley regions VA3 may include a (3-1)-th valley region VA3_1 and a (3-2)-th valley region VA3_2. The (3-1)-th and (3-2)-th valley regions VA3_1 and VA3_2 may be spaced apart from each other.

In an embodiment of inventive concept, the (3-1)-th valley region VA3_1 may enclose the first short side of the third pixel region PXA-R, a portion of the first long side of the third pixel region PXA-R adjacent to the first short side, and a portion of the second long side of the third pixel region PXA-R adjacent to the first short side. The (3-2)-th valley region VA3_2 may enclose the second short side of the third pixel region PXA-R, a portion of the first long side of the third pixel region PXA-R adjacent to the second short side, and a portion of the second long side of the third pixel region PXA-R adjacent to the second short side.

One end E1_3 of the (3-1)-th valley region VA3_1 and one end E2_3 of the (3-2)-th valley region VA3_2 may face each other in the first direction DR1. The other end E3_3 of the (3-1)-th valley region VA3_1 and the other end E4_3 of the (3-2)-th valley region VA3_2 may face each other in the first direction DR1.

In this embodiment, the third non-valley region NVA3 may be provided in plurality on one third virtual line L3, wherein the plurality of third non-valley regions NVA3 may include a (3-1)-th non-valley region NVA3_1 and a (3-2)-th non-valley region NVA3_2.

The (3-1)-th non-valley region NVA3_1 may be disposed between one end E1_3 of the (3-1)-th valley region VA3_1 and one end E2_3 of the (3-2)-th valley region VA3_2, and the (3-2)-th non-valley region NVA3_2 may be disposed between the other end E3_3 of the (3-1)-th valley region VA3_1 and the other end E4_3 of the (3-2)-th valley region VA3_2.

Each of the (3-1)-th and (3-2)-th non-valley regions NVA3_1 and NVA3_2 may extend in the first direction DR1. That is, in this embodiment, the third non-valley regions NVA3 may be perpendicular to the extension direction of the first non-valley regions NVA1.

The (3-1)-th and (3-2)-th non-valley regions NVA3_1 and NVA3_2 may be respectively disposed adjacent to the first and second long sides of the third pixel region PXA-R. The (3-1)-th non-valley region NVA3_1 may be disposed to be spaced apart from the third pixel opening OP-R in the second direction DR2, and the (3-2)-th non-valley region NVA3_2 may be disposed to be spaced apart from the third pixel opening OP-R in a direction opposite to the second direction DR2.

In this embodiment, the length of the (3-1)-th non-valley region NVA3_1 in the first direction DR1 may be substantially the same as the length of the (3-2)-th non-valley region NVA3_2 in the first direction DR1. In this case, the (3-1)-th non-valley region NVA3_1 and the (3-2)-th non-valley region NVA3_2 may face each other in the second direction DR2. The (3-1)-th non-valley region NVA3_1 and the (3-2)-th non-valley region NVA3_2 may be disposed to entirely overlap each other when viewed in the second direction DR2.

In the display panel DP according to this embodiment, in order to prevent a lateral leakage current from occurring between adjacent pixels, the valley regions VA1, VA2, and VA3 enclosing some of the pixel regions PXA-G, PXA-B, and PXA-R are defined. Meanwhile, in this specification, the expression "lateral leakage current" refers to a current flowing in a direction crossing the third direction DR3, other than a current flowing in the third direction DR3, which is the stacking direction of the light-emitting element OLED (see FIGS. 3C and 3D), that is, the direction in which an image is displayed. The lateral leakage current may refer to a current flowing in a direction parallel to a plane defined by the first and second directions DR1 and DR2.

According to this embodiment, valley patterns respectively corresponding to the valley regions VA1, VA2, and VA3 may be defined in the pixel defining layer PDL, and each of the valley patterns may be formed as the pixel defining layer PDL is recessed in the thickness direction. Accordingly, by preventing the lateral leakage current from occurring, color mixing between adjacent pixels and luminance decrease may be prevented. A detailed description of the valley patterns will be given later.

According to this inventive concept, the pixel defining layer PDL may include non-valley regions NVA1, NVA2, and NVA3 defined as regions in which valley patterns are not formed so that a driving voltage can be transmitted to the second electrode CE (see FIG. 3B). In this inventive concept, at least one first non-valley region NVA1, at least one second non-valley region NVA2, and at least one third non-valley region NVA3 may be disposed so as not to face each other. In this specification, the expression "being disposed not to face each other" may mean that different non-valley regions do not overlap each other in a portion in which a shortest distance between adjacent pixel regions is defined. In this specification, the expression "different non-valley regions" means non-valley regions respectively disposed on different virtual lines.

When the non-valley regions NVA1, NVA2, and NVA3 are defined to face each other, a lateral leakage current may occur between adjacent pixels through the non-valley regions NVA1, NVA2, and NVA3 facing each other. According to this embodiment, by disposing the non-valley regions NVA1, NVA2, and NVA3 so as not to face each other, it is possible to prevent the lateral leakage current from occurring between adjacent pixels through the non-valley regions NVA1, NVA2, and NVA3 facing each other.

According to this embodiment, a shortest distance d between different non-valley regions NVA1, NVA2, and NVA3 may be about 10 micrometers or more. For example, the shortest distance d between the different non-valley regions NVA1, NVA2, and NVA3 may be about 10 micrometers to about 100 micrometers.

When the shortest distance d between the different non-valley regions NVA1, NVA2, and NVA3 is less than about 10 micrometers, a current may not be sufficiently offset in a process in which the current flowing away from a pixel region through one non-valley region in a lateral direction flows up to another adjacent non-valley region. Accordingly, a current flowing in a direction parallel to a plane from one pixel region may reach another adjacent pixel region through one non-valley region and another non-valley region adjacent to the one non-valley region, and a lateral leakage current may occur between adjacent pixels.

On the other hand, as in this embodiment, when the shortest distance d between the different non-valley regions NVA1, NVA2, and NVA3 is about 10 micrometers or more, a current may be mostly offset in a process in which the current flowing away from a pixel region through one non-valley region in a lateral direction flows up to another adjacent non-valley region. Accordingly, the occurrence of a lateral leakage current between adjacent pixels may be minimized.

When the shortest distance d between the different non-valley regions NVA1, NVA2, and NVA3 exceeds about 100 micrometers, as a separation distance between adjacent pixels also increases, it becomes difficult to obtain a required resolution and therefore, a display panel DP with degraded display quality may be provided.

In this embodiment, in the first, (2-1)-th, and third pixel regions PXA-G, PXA-B1, and PXA-R adjacent to each other, each of the shortest distances between different non-valley regions disposed adjacent to each other among the first, (2-1)-th, (2-2)-th, and third non-valley regions NVA1, NVA2_1, NVA2_2, and NVA3 may be about 10 micrometers or more. In addition, in the first, (2-2)-th, and third pixel regions PXA-G, PXA-B2, and PXA-R adjacent to each other, each of the shortest distances between different non-valley regions disposed adjacent to each other among the first, (2-3)-th, (2-4)-th, and third non-valley regions NVA1, NVA2_3, NVA2_4, and NVA3 may be about 10 micrometers or more.

In this specification, a shortest distance between the different non-valley regions NVA1, NVA2, and NVA3 is defined as a moving distance of a current flowing from one end of one non-valley region to one end of another non-valley region with respect to the first and second directions DR1 and DR2.

Hereinafter, a shortest distance between the non-valley regions in the (2-1)-th pixel region PXA-B1 and the first and third pixel regions PXA-G and PXA-R disposed on the left side from the (2-1)-th pixel region PXA-B1 and a shortest distance between the non-valley regions in the (2-2)-th pixel region PXA-B2 and the first and third pixel regions PXA-G and PXA-R disposed on the left side from the (2-2)-th pixel region PXA-B2 will be described in detail with reference to FIG. 4B. The above description may be similarly applied to a shortest distance between the non-valley regions in the (2-1)-th pixel region PXA-B1 and the first and third pixel regions PXA-G and PXA-R disposed on the right side from the (2-1)-th pixel region PXA-B1 and a shortest distance between the non-valley regions in the (2-2)-th pixel region PXA-B2 and the first and third pixel regions PXA-G and PXA-R disposed on the right side from the (2-2)-th pixel region PXA-B2.

First, in the non-valley regions of the (2-1)-th pixel region PXA-B1 and the first and third pixel regions PXA-G and PXA-R disposed on the left side from the (2-1)-th pixel region PXA-B1, a shortest distance between the (1-1)-th and (2-2)-th non-valley regions NVA1_1 and NVA2_2 may be defined as a moving distance d1_1 of a current flowing in the second direction DR2 between an extension line of one end of the (1-1)-th non-valley region NVA1_1 and an extension line of one end of the (2-2)-th non-valley region NVA2_2. One end of the (1-1)-th non-valley region NVA1_1 may correspond to one end E1_1 of the (1-1)-th valley region VA1_1 described above, and one end of the (2-2)-th non-valley region NVA2_2 may correspond to one end E4_2 of the (2-2)-th valley region VA2_2 described above.

A shortest distance between adjacent (1-1)-th and (3-2)-th non-valley regions NVA1_1 and NVA3_2 may be defined as the length of a shortest moving path (that is, corresponding to the sum of a shortest moving distance d2_1b in the second direction DR2 and a shortest moving distance d2_1a in the first direction DR1 as illustrated in FIG. 4B) from the central point (hereinafter referred to as a first point) between one end of the (1-1)-th non-valley region NVA1_1 and an adjacent (2-2)-th valley region VA2_2 to the central point (hereinafter referred to as a second point) between one end of the (3-2)-th non-valley region NVA3_2 and an adjacent (1-1)-th valley region VA1_1. One end of the (3-2)-th non-valley region NVA3_2 may correspond to the other end E3_3 of the (3-1)-th valley region VA3_1 described above.

A shortest distance between adjacent (2-2)-th and (3-2)-th non-valley regions NVA2_2 and NVA3_2 may be defined as a moving distance d3_1 of a current flowing in the first direction DR1 between an extension line of one end of the (3-2)-th non-valley region NVA3_2 and the (2-2)-th non-valley region NVA2_2.

In the (2-2)-th pixel region PXA-B2 and the first and third pixel regions PXA-G and PXA-R disposed on the left side from the (2-2)-th pixel region PXA-B2, a shortest distance between adjacent (1-1)-th and (2-3)-th non-valley regions NVA1_1 and NVA2_3 may be defined as a moving distance d1_2 of a current flowing in the second direction DR2 between an extension line of one end of the (1-1)-th non-valley region NVA1_1 and an extension line of one end of the (2-3)-th non-valley region NVA2_3. One end of the (1-1)-th non-valley region NVA1_1 may correspond to one end E1_1 of the (1-1)-th valley region VA1_1 described above, and one end of the (2-3)-th non-valley region NVA2_3 may correspond to one end E6_2 of the (2-3)-th valley region VA2_3 described above.

A shortest distance between adjacent (1-1)-th and (3-2)-th non-valley regions NVA1_1 and NVA3_2 may be defined as the length of a shortest moving path (that is, corresponding to the sum of a shortest moving distance d2_2b in the second direction DR2 and a shortest moving distance d2_2a in the first direction DR1 as illustrated in FIG. 4B) from the central point between one end of the (1-1)-th non-valley region NVA1_1 and an adjacent (2-3)-th valley region VA2_3 to the central point between one end of the (3-2)-th non-valley region NVA3_2 and an adjacent (1-1)-th valley region VA1_1. One end of the (3-2)-th non-valley region NVA3_2 may correspond to the other end E3_3 of the (3-1)-th valley region VA3_1 described above.

A shortest distance between adjacent (2-3)-th and (3-2)-th non-valley regions NVA2_3 and NVA3_2 may be defined as the length of a shortest moving path (that is, corresponding to the sum of a shortest moving distance d3_2b in the second direction DR2 and a shortest moving distance d3_2a in the first direction DR1 as illustrated in FIG. 4B) from the central point between one end of the (2-3)-th non-valley region NVA2_3 and an adjacent (3-1)-th valley region VA3_1 to the central point between one end of the (3-2)-th non-valley region NVA3_2 and an adjacent (1-1)-th valley region VA1_1.

FIG. 4A exemplarily illustrates the shortest distance d between adjacent first and second non-valley regions NVA1 and NVA2 among the shortest distances between the different non-valley regions NVA1, NVA2, and NVA3.

In Table 1 below, according to this embodiment, the first to third valley regions VA1, VA2, and VA3 are designed according to the embodiment described above in FIG. 4A, and a minimum value among the shortest distances d between the different non-valley regions NVA1, NVA2, and NVA3 is set to about 20 micrometers.

In Table 1 below, according to a comparative embodiment, one valley region may be disposed respectively between adjacent first and second pixel regions PXA-G and PXA-B, between adjacent second and third pixel regions PXA-B and PXA-R, and between adjacent first and third pixel regions PXA-G and PXA-R, and the one valley region may be provided to extend in a direction perpendicular to the direction in which adjacent pixel regions are spaced apart from each other.

Gray crushing and parasitic emission for each of the first to third pixel regions PXA-G, PXA-B, and PXA-R are measured, and Table 1 below shows the rate of increase in gray crushing and the rate of decrease in parasitic emission according to this embodiment, compared to the comparative embodiment.

TABLE 1

| | Rate of increase in gray crushing (%) according to this embodiment, compared to the comparative embodiment | Rate of decrease in parasitic emission (%) according to this embodiment, compared to the comparative embodiment |
|---|---|---|
| First pixel (G) | 6.4 | 76.0 |
| Second pixel (B) | 3.0 | 15.4 |
| Third pixel (R) | 53.1 | 41.7 |

A gray crushing ratio means a ratio of an amount of current flowing through one pixel when only the one pixel is activated to an amount of current flowing through each of first to third pixels when all the first to third pixels are activated. An increase in gray crushing may mean that an amount of lateral leakage current flowing from one pixel to adjacent pixels is reduced and thus an amount of current flowing through one pixel is increased.

In the comparative embodiment, the gray crushing of the third pixel was lower than the gray crushing of the first and second pixels, but in this embodiment, the gray crushing of the third pixel may be increased to a higher rate than the comparative embodiment. Through this, it can be seen that according to this embodiment, the amount of lateral leakage current flowing from the third pixel to the adjacent first and second pixels may be effectively reduced.

Parasitic emission means a degree of movement of a color coordinate of one pixel when only one pixel is activated, compared to a color coordinate of each of the first to third pixels when all the first to third pixels are activated. Reduction in parasitic emission means that a degree of change in color coordinate is small, which may mean that the amount of light of different colors emitted from other pixels is decreased as a lateral leakage current is reduced due to adjacent pixels.

In the comparative embodiment, the parasitic emission for the first pixel was higher than the parasitic emission for the second and third pixels, but in this embodiment, the parasitic emission for the first pixel may be reduced at a higher reduction rate than the comparative embodiment. It can be seen that the color coordinate of the first pixel may be considered to be relatively more affected by a lateral leakage current than the color coordinates of the second and third pixels, and according to this embodiment, it can be confirmed that the degree of movement of the color coordinate of the first pixel due to the lateral leakage current flowing from the first pixel to the adjacent pixels may be effectively reduced.

Accordingly, as in this embodiment, the valley regions VA1, VA2, and VA3 and the non-valley regions NVA1, NVA2, and NVA3 are disposed so as to enclose each of the first to third pixel openings OP-G, OP-B, and OP-R, and when the non-valley regions are disposed so that each of the shortest distances d between the different non-valley regions NVA1, NVA2, and NVA3 is about 20 micrometers or more, it can be confirmed that the lateral leakage current flowing to adjacent pixels is effectively prevented.

In this embodiment designed for measurement of gray crushing and parasitic emission, a distance between adjacent valley regions VA1, VA2, and VA3 was set to about 3.5 micrometers to about 4.0 micrometers. Meanwhile, in an embodiment of the inventive concept, the distance between the adjacent valley regions VA1, VA2, and VA3 may be increased up to twice the range of this embodiment designed for measuring gray crushing and parasitic emission. For example, it may be increased up to about 7.0 micrometers to about 8.0 micrometers. That is, the distance between the adjacent valley regions VA1, VA2, and VA3 may be about 3.5 micrometers to about 8.0 micrometers.

When the distance between the adjacent valley regions VA1, VA2, and VA3 is doubled compared to this embodiment, although a shortest distance between different non-valley regions is reduced by up to 0.5 times, a current may be sufficiently offset in a process in which the current flows from one pixel to another adjacent pixel. In other words, although the shortest distance between the different non-valley regions NVA1, NVA2, and NVA3 is set to about 10 micrometers, the lateral leakage current flowing to adjacent pixels may be effectively prevented.

Through this, as in this embodiment, the valley regions VA1, VA2, and VA3 and the non-valley regions NVA1, NVA2, and NVA3 are disposed in the pixel defining layer PDL so as to enclose each of the first to third pixel openings OP-G, OP-B, and OP-G. When the shortest distance d between the different non-valley regions NVA1, NVA2, and NVA3 is about 10 micrometers or more, it is possible to prevent a decrease in luminance by preventing the lateral leakage current, and through this, the display efficiency of the display panel DP (see FIG. 2) may be improved. In addition, color mixing between adjacent pixels may be prevented, and through this, the display quality of the display panel DP (see FIG. 2) may be improved.

Figure 5:
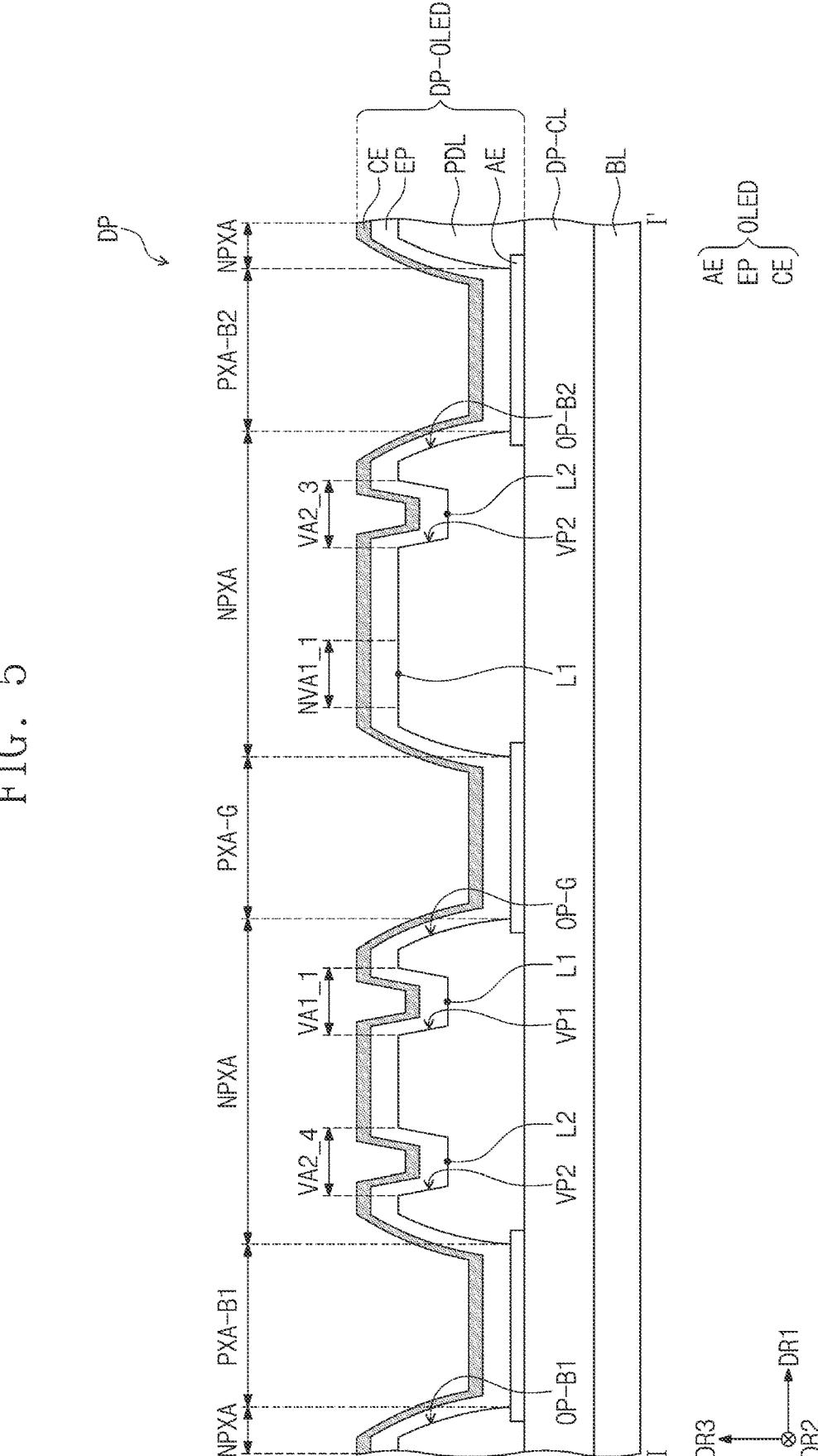
FIG. 5 is an enlarged cross-sectional view of a portion of the display panel according to an embodiment of the inventive concept, which is taken along line I-I' of FIG. 4A.
Figure 6A:
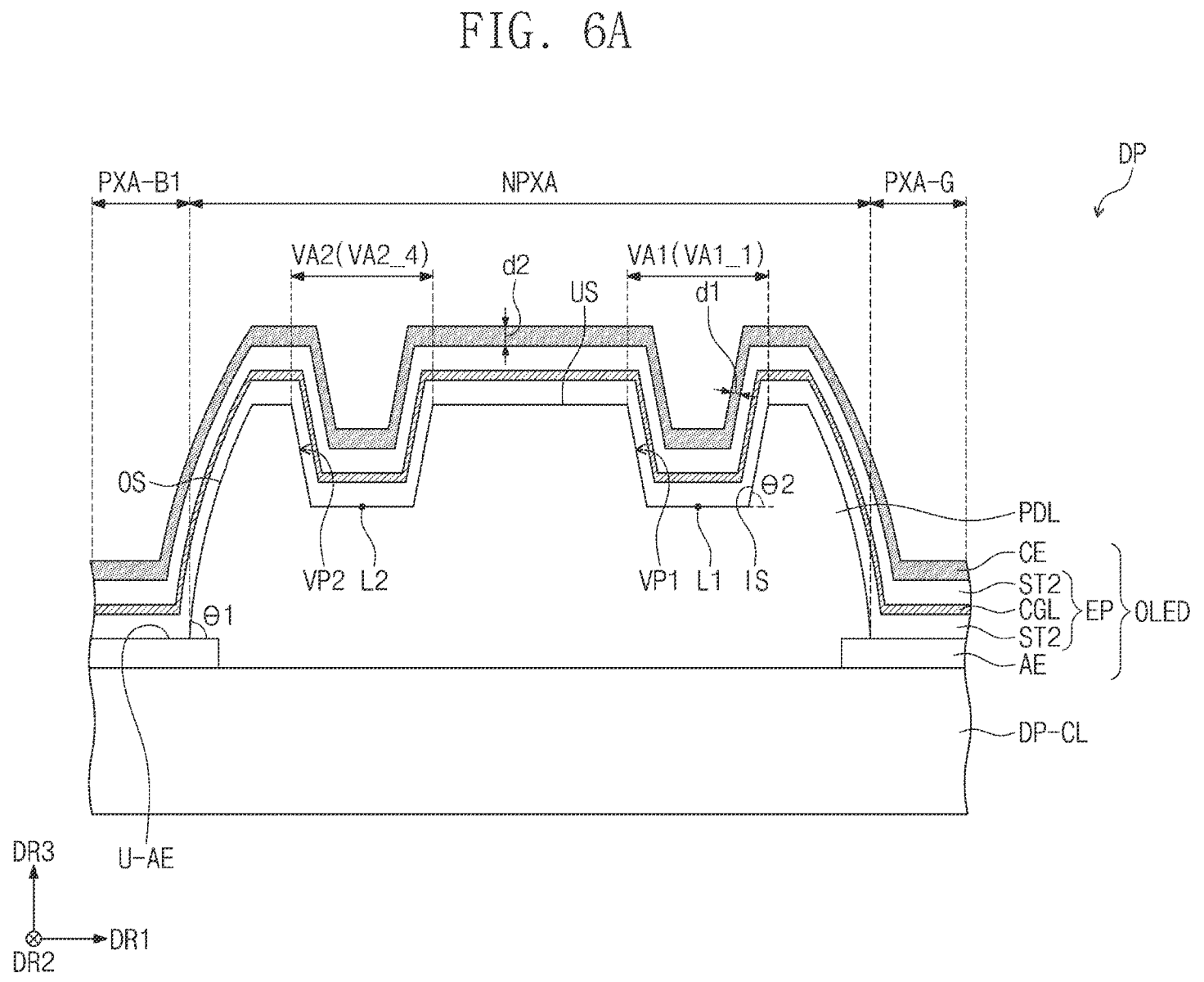
Figure 6B:
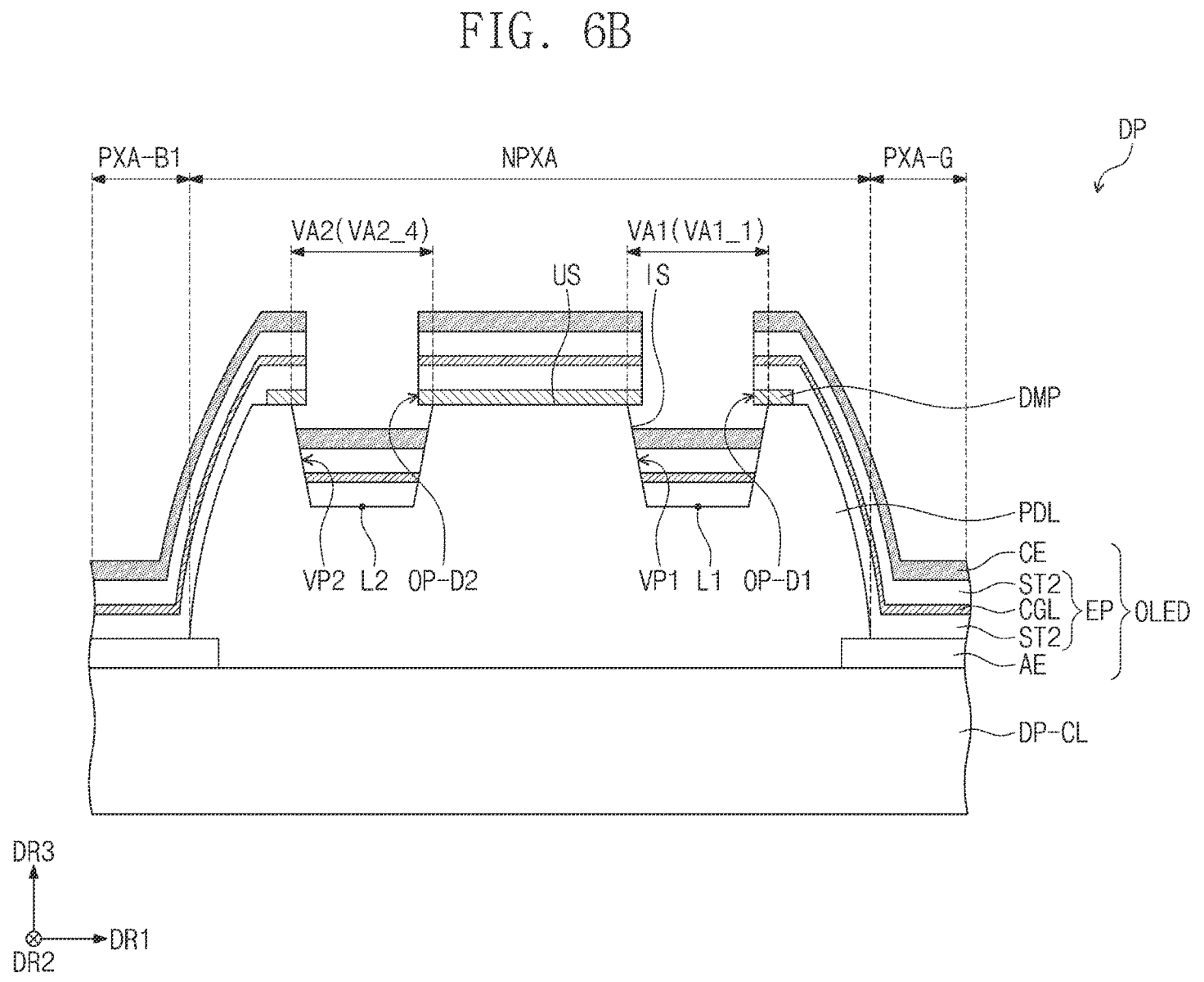

FIG. 5 is an enlarged cross-sectional view of a portion of the display panel according to an embodiment of the inventive concept, which is taken along line I-I' of FIG. 4A. FIGS. 6A and 6B are enlarged cross-sectional views of a portion of the display panel according to an embodiment of the inventive concept. Same/similar reference numerals will be used for the same/similar elements as those described in FIGS. 1 to 4B, and duplicate descriptions will be omitted.

Referring to FIGS. 5 and 6A, the display panel DP according to an embodiment of the inventive concept includes a base layer BL, a circuit element layer DP-CL disposed on the base layer BL, and a display element layer DP-OLED. Although illustration is omitted in FIGS. 5 and 6A, an upper insulating layer TFL (see FIGS. 3A and 3B) may be further disposed on the display element layer DP-OLED.

The light-emitting element OLED disposed on the circuit element layer DP-CL may include a first electrode AE, a light-emitting portion EP, and a second electrode CE sequentially stacked. The light-emitting portion EP in FIG. 5 may include the first light-emitting stack ST1, the charge generation layer CGL, and the second light-emitting stack ST2 described above with reference to FIG. 3C, wherein the first light-emitting stack ST1 may include at least a first light-emitting layer EML1, and the second light-emitting stack ST2 may include at least a second light-emitting layer EML2. Meanwhile, as described above with reference to FIG. 3D, the light-emitting portion EP may include three light-emitting stacks ST1, ST2, and ST3 and two charge generation layers CGL1 and CGL2 disposed between the three light-emitting stacks ST1, ST2, and ST3.

According to this inventive concept, valley patterns VP1 and VP2 respectively corresponding to the valley regions VA1 and VA2 may be defined in the pixel defining layer PDL. Each of the valley patterns VP1 and VP2 may be defined as a recessed portion of the pixel defining layer PDL recessed from an upper surface US of the pixel defining layer PDL toward the third direction DR3 that is the thickness direction.

The valley patterns VP1 and VP2 may include at least one first valley pattern VP1, at least one second valley pattern VP2, and at least one third valley pattern. At least one first valley pattern VP1 may be defined to correspond to at least one first valley region VA1, at least one second valley pattern VP2 may be defined to correspond to at least one second valley region VA2, and at least one third valley pattern may be defined to correspond to at least one third valley region VA3 (see FIG. 4A). The first valley region VA1, the second valley region VA2, and the third valley region VA3 (see FIG. 4A) of the pixel defining layer PDL may be regarded as regions in which the first valley pattern VP1, the second valley pattern VP2, and the third valley pattern are defined, respectively.

In an embodiment of the inventive concept, an outer side surface OS of the pixel defining layer PDL may have a shape inclined at a first angle θ1 with respect to an upper surface U-AE of the first electrode AE. For example, the first angle θ1 may be about 10 degrees to about 20 degrees. In an embodiment of the inventive concept, an inner side surface IS of the pixel defining layer PDL defining each of the valley patterns VP1 and VP2 may have a shape inclined at a second angle θ2 with respect to the upper surface U-AE of the first electrode AE. The second angle θ2 may be different from the first angle θ1. For example, the second angle θ2 may be about 70 degrees to about 90 degrees. Accordingly, the pixel defining layer PDL may have a shape in which the inclined angles of the outer side surface OS and the inner side surface IS are different from each other.

The thickness of a portion of the light-emitting portion EP disposed on the inner side surface IS of the pixel defining layer PDL defining corresponding valley patterns VP1 and VP2 may be smaller than the thickness of a portion of the light-emitting portion EP disposed on the upper surface US of the pixel defining layer PDL. Accordingly, as the resistance of the light-emitting portion EP is increased, a current may be prevented from leaking along the light-emitting portion EP.

For example, as illustrated in FIG. 6A, each of the first light-emitting stack ST1, the charge generation layer CGL, and the second light-emitting stack ST2 included in the light-emitting portion EP may be thinly formed in a corresponding valley pattern. In particular, a lateral leakage current may flow along the first hole control layer HTR1 (see FIG. 3C) and/or the charge generation layer CGL of the first light-emitting stack ST1, but according to this embodiment, the resistance of the first hole control layer HTR1 (see FIG. 3C) and/or the charge generation layer CGL may be increased, and a current may be prevented from leaking along the first hole control layer HTR1 (see FIG. 3C) and/or the charge generation layer CGL.

In addition, a first thickness d1 of a portion of the second electrode CE disposed on the inner side surface IS of the pixel defining layer PDL defining corresponding valley patterns VP1 and VP2 may be smaller than a second thickness d2 of a portion of the second electrode CE disposed on the upper surface US of the pixel defining layer PDL. For example, the first thickness d1 may be about 0.125 times to about 0.25 times the second thickness d2.

According to this inventive concept, the shapes of at least one first valley region VA1 and at least one first non-valley region NVA1 (see FIG. 4A) may be atypically designed so as for the non-valley regions NVA1, NVA2, and NVA3 to be disposed away from each other. For example, as described above with reference to FIG. 4A, at least some of the plurality of first non-valley regions NVA1, NVA2, and NVA3 (see FIG. 4A) may be disposed not to face each other in the first direction DR1, and alternatively, only one first non-valley region NVA1 (see FIG. 4A) may be disposed.

Accordingly, on a cross section viewed in the second direction DR2, a valley region (e.g., the (1-1)-th valley region VA1_1) may be defined in a portion (e.g., a portion spaced apart in a direction opposite to the first direction DR1) adjacent to one side of the first pixel region PXA-G (or the first pixel opening OP-G), but a non-valley region (e.g., the (1-1)-th non-valley region NVA1_1) may be defined in a portion (e.g., a portion spaced apart in the first direction DR1) adjacent to the other side of the first pixel region PXA-G (or the first pixel opening OP-G).

Referring to FIG. 6B, the display panel DP according to an embodiment of the inventive concept may further include a dummy pattern DMP disposed on the pixel defining layer PDL. The dummy pattern DMP may be disposed on the upper surface US of the pixel defining layer PDL and may be covered by the light-emitting portion EP.

Dummy openings OP-D1 and OP-D2 respectively corresponding to the valley regions VA1, VA2, and VA3 (see FIG. 4A) may be defined in the dummy pattern DMP. The dummy openings OP-D1 and OP-D2 may include first to third dummy openings OP-D1 and OP-D2, wherein the first to third dummy openings OP-D1 and OP-D2 may respectively correspond to the first to third valley regions VA1, VA2, and VA3 (see FIG. 4A). FIG. 6B exemplarily illustrates one first dummy opening OP-D1 and one second dummy opening OP-D2.

In an embodiment of the inventive concept, the dummy pattern DMP may be a remaining portion of a mask used in a process of forming the valley patterns VP1 and VP2. The valley patterns VP1 and VP2 of the pixel defining layer PDL according to an embodiment of the inventive concept may be formed by using a patterned inorganic oxide film as a mask, and the dummy pattern DMP may be a remaining unetched portion of the patterned inorganic oxide film used as a mask. In an embodiment of the inventive concept, the dummy pattern DMP may contain indium gallium zinc oxide (IGZO).

In other words, the embodiment of FIG. 6A may correspond to removing all masks used in the process of forming the valley patterns VP1 and VP2, and the embodiment of FIG. 6B may correspond to not removing a portion, which is disposed on the upper surface of the pixel defining layer PDL, among all masks used in the process of forming the valley patterns VP1 and VP2.

In this embodiment, the lower surface of the dummy pattern DMP connected to an inner side surface of the dummy pattern DMP overlapping the first valley region VA1 and defining the first dummy opening OP-D1 may be exposed from and uncovered by the pixel defining layer PDL. In other words, the width of the first dummy opening OP-D1 on a cross section may be smaller than the maximum width of the first valley region VA1. In addition, a portion of the dummy pattern DMP may overlap the first valley region VA1. Although the first dummy opening OP-D1 has been mainly described, the same description may be applied to the second dummy opening OP-D2 and the third dummy opening.

In an embodiment of the inventive concept, the valley patterns VP1 and VP2 may be formed through a wet etching process on the pixel defining layer PDL with the use of a mask. The mask may contain a material having an etching selectivity higher than that of the pixel defining layer PDL with respect to an etching solution, and each of the valley patterns VP1 and VP2 may be etched so that the width of each of the valley patterns VP1 and VP2 on a cross section is formed to be greater than the opening width of a corresponding mask. In this case, the dummy pattern DMP may be formed by not removing a portion of the mask protruding from the upper surface of the pixel defining layer PDL toward the center of the valley region after the wet etching process of the pixel defining layer PDL.

In this embodiment, the light-emitting portion EP and the second electrode CE may be separated from each other by a protruding dummy pattern DMP. That is, a portion of the light-emitting portion EP disposed on the dummy pattern DMP and a portion of the light-emitting portion EP disposed in corresponding valley patterns VP1 and VP2 of the light-emitting portion EP may be spaced apart from each other. A portion of the second electrode CE disposed on the dummy pattern DMP and a portion of the second electrode CE disposed in the corresponding valley patterns VP1 and VP2 may also be spaced apart from each other. Accordingly, it is possible to more effectively prevent a lateral leakage current from flowing between adjacent pixels in a direction parallel to a plane defined by the first and second directions DR1 and DR2.

Figure 7:
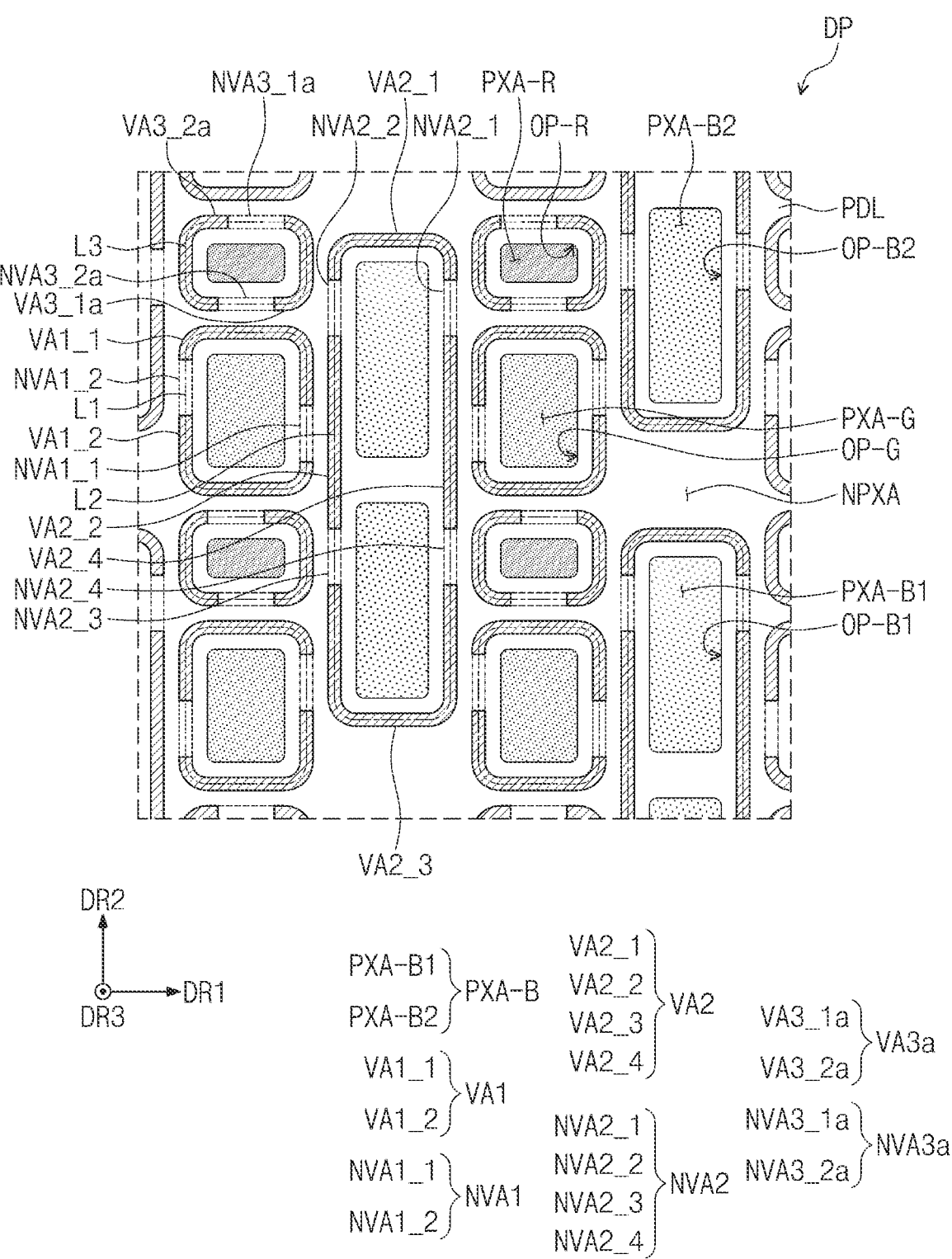
FIGS. 7, 8, 9, 10, 11, 12, and 13 are enlarged plan views of a portion of a display panel according to an embodiment of the inventive concept.

FIG. 7 is an enlarged plan view of a portion of a display panel according to an embodiment of the inventive concept. Referring to FIG. 7, the pixel defining layer PDL may include first valley regions VA1 and first non-valley regions NVA1 disposed on a corresponding first virtual line L1, second valley regions VA2 and second non-valley regions NVA2 disposed on a corresponding second virtual line L2, and third valley regions VA3a and third non-valley regions NVA3a disposed on a corresponding third virtual line L3. Hereinafter, same/similar reference numerals will be used for the same/similar elements as those described in FIGS. 4A and 4B, duplicate descriptions will be omitted, and differences will be mainly described.

The third valley regions VA3a may include (3-1)-th and (3-2)-th valley regions VA3_1a and VA3_2a, and the third non-valley regions NVA3a may include (3-1)-th and (3-2)-th non-valley regions NVA3_1a and NVA3_2a. Each of the (3-1)-th and (3-2)-th non-valley regions NVA3_1a and NVA3_2a may extend in the second direction DR2.

In this embodiment, the length of the (3-1)-th non-valley region NVA3_1a in the first direction DR1 may be substantially the same as the length of the (3-2)-th non-valley region NVA3_2a in the first direction DR1. A portion of the (3-1)-th non-valley region NVA3_1a may overlap the (3-2)-th valley region VA3_2a when viewed in the second direction DR2, and a portion of the (3-2)-th non-valley region NVA3_2a may overlap the (3-1)-th valley region VA3_1a when viewed in the second direction DR2.

According to this embodiment, the (3-1)-th and (3-2)-th non-valley regions NVA3_1a and NVA3_2a disposed on the corresponding third virtual line L3 may be asymmetrically disposed with respect to a reference line passing through the center of the third pixel region PXA-R and extending in the first direction DR1. For example, the (3-1)-th non-valley region NVA3_1a may be disposed closer to one of the first and second short sides of the third pixel region PXA-R than the (3-2)-th non-valley region NVA3_2a. Through this, when compared to the embodiment described above in FIG. 4A, a shortest distance between the (2-2)-th non-valley region NVA2_2 and an adjacent (3-1)-th non-valley region NVA3_1a and a shortest distance between the (2-3)-th non-valley region NVA2_3 and an adjacent (3-2)-th non-valley region NVA3_2a may be increased. Accordingly, it is possible to more effectively prevent a lateral leakage current from occurring between pixels adjacent to each other through (2-2)-th and (3-1)-th non-valley regions NVA2_2 and NVA3_1a adjacent to each other or (2-3)-th and (3-1)-th non-valley regions NVA2_3 and NVA3_1a adjacent to each other.

Meanwhile, the length and arrangement of the (3-1)-th and (3-2)-th non-valley regions NVA3_1a and NVA3_2a are not limited to those illustrated in FIG. 7 and may be designed without restrictions as long as a shortest distance to other adjacent non-valley regions NVA2 and NVA3 can be increased.

Alternatively, FIG. 7 exemplarily illustrates that the (3-1)-th and (3-2)-th non-valley regions NVA3_1a and NVA3_2a are asymmetrically disposed, but the embodiment of the inventive concept is not limited thereto. For example, the (2-1)-th to (2-4)-th non-valley regions NVA2_1, NVA2_2, NVA2_3, and NVA2_4 may be asymmetrically disposed with respect to a reference line passing through the center of the second pixel region PXA-B and extending in the second direction DR2.

Figure 8:
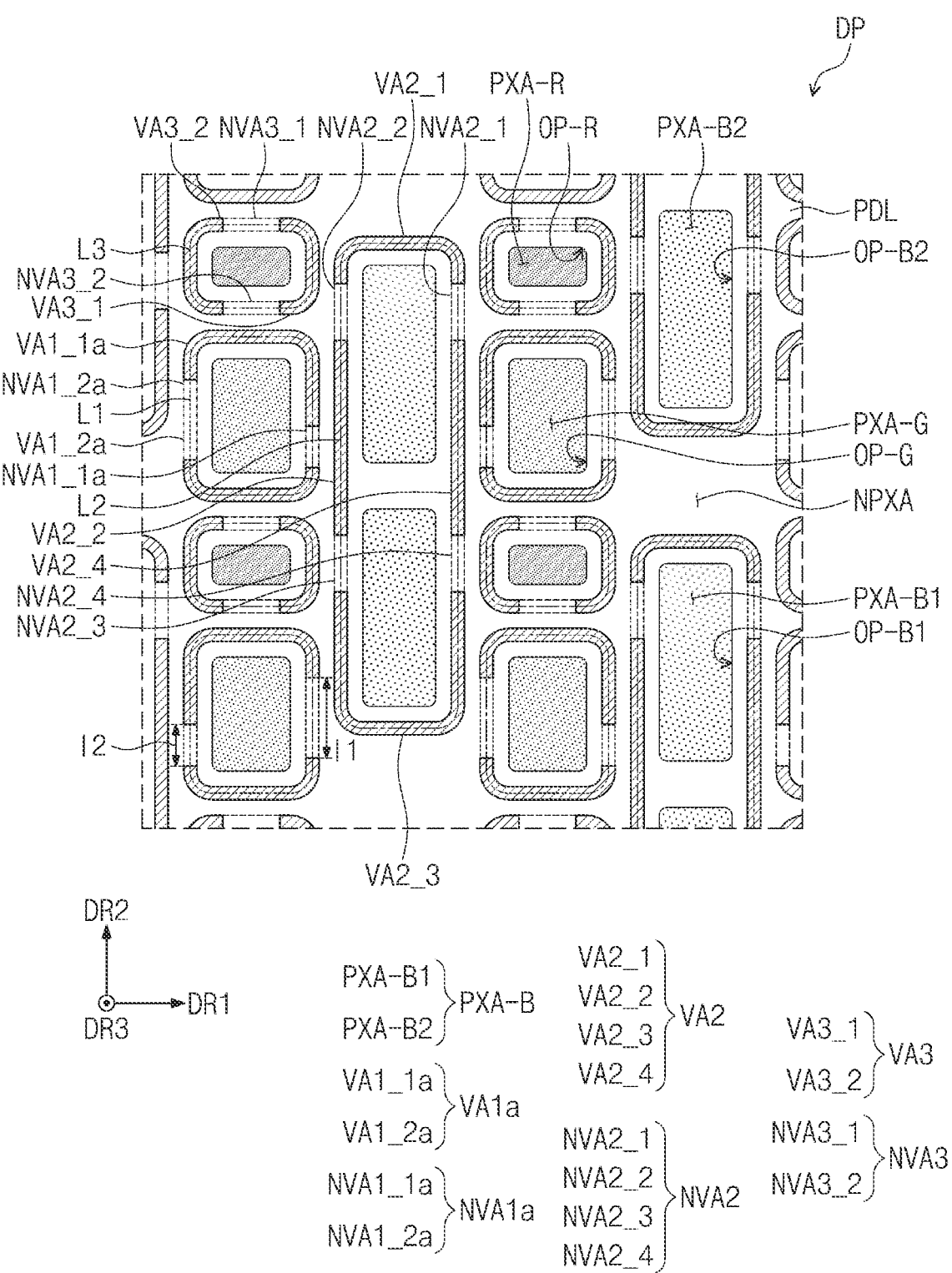

FIG. 8 is an enlarged plan view of a portion of a display panel according to an embodiment of the inventive concept. Same/similar reference numerals will be used for the same/similar elements as those described in FIGS. 4A and 4B, duplicate descriptions will be omitted, and differences will be mainly described.

Referring to FIG. 8, the first valley regions VA1a may include (1-1)-th and (1-2)-th valley regions VA1_1a and VA1_2a, and the first non-valley regions NVA1a may include (1-1)-th and (1-2)-th non-valley regions NVA1_1a and NVA1_2a. Each of the (1-1)-th and (1-2)-th non-valley regions NVA1_1a and NVA1_2a may extend in the second direction DR2.

In this embodiment, a length 11 of the (1-1)-th non-valley region NVA1_1a in the second direction DR2 may be different from a length 12 of the (1-2)-th non-valley region NVA1_2a in the second direction DR2. In other words, the length 11 of the (1-1)-th non-valley region NVA1_1a disposed on one side of one first pixel region PXA-G and the length 12 of the (1-2)-th non-valley region NVA1_2a disposed on the other side of one first pixel region PXA-G may be set to be different from each other. Through this, shortest distances between each of the (1-1)-th and (1-2)-th non-valley regions NVA1_1a and NVA1_2a and other non-valley regions adjacent the (1-1)-th and (1-2)-th non-valley regions NVA1_1a and NVA1_2a may be increased.

For example, the (2-1)-th pixel region PXA-B1 may be disposed closer to the second short side of an adjacent first pixel region PXA-G than the (2-2)-th pixel region PXA-B2. Accordingly, a separation distance between each of the (2-1)-th and (2-2)-th non-valley regions NVA2_1 and NVA2_2 and an adjacent first pixel region PXA-G may be shorter than a separation distance between each of the (2-3)-th and (2-4)-th non-valley regions NVA2_3 and NVA2_4 and an adjacent first pixel region PXA-G.

In this case, by designing the length of the (1-2)-th non-valley region NVA1_2a adjacent to the (2-1)-th non-valley region NVA2_1 to be smaller than the length of the (1-1)-th non-valley region NVA1_1a disposed on the same first virtual line L1, a shortest distance between the (2-1)-th and (1-2)-th non-valley regions NVA2_1 and NVA1_2a may be increased.

In addition, by designing the length of the (1-1)-th non-valley region NVA1_1a adjacent to the (2-2)-th non-valley region NVA2_2 to be smaller than the length of the (1-2)-th non-valley region NVA1_2a disposed on the same first virtual line L1, a shortest distance between the (2-2)-th and (1-1)-th non-valley regions NVA2_2 and NVA1_1a may be increased.

Meanwhile, FIG. 8 exemplarily illustrates that the (1-1)-th and (1-2)-th non-valley regions NVA1_1$a$ and NVA1_2$a$ are disposed to have different lengths, but the embodiment of the inventive concept is not limited thereto. For example, some of the (2-1)-th to (2-4)-th non-valley regions NVA2_1, NVA2_2, NVA2_3, and NVA2_4 may be disposed to have different lengths. Alternatively, the (3-1)-th and (3-2)-th non-valley regions NVA3_1 and NVA3_2 may be disposed to have different lengths.

Figure 9:
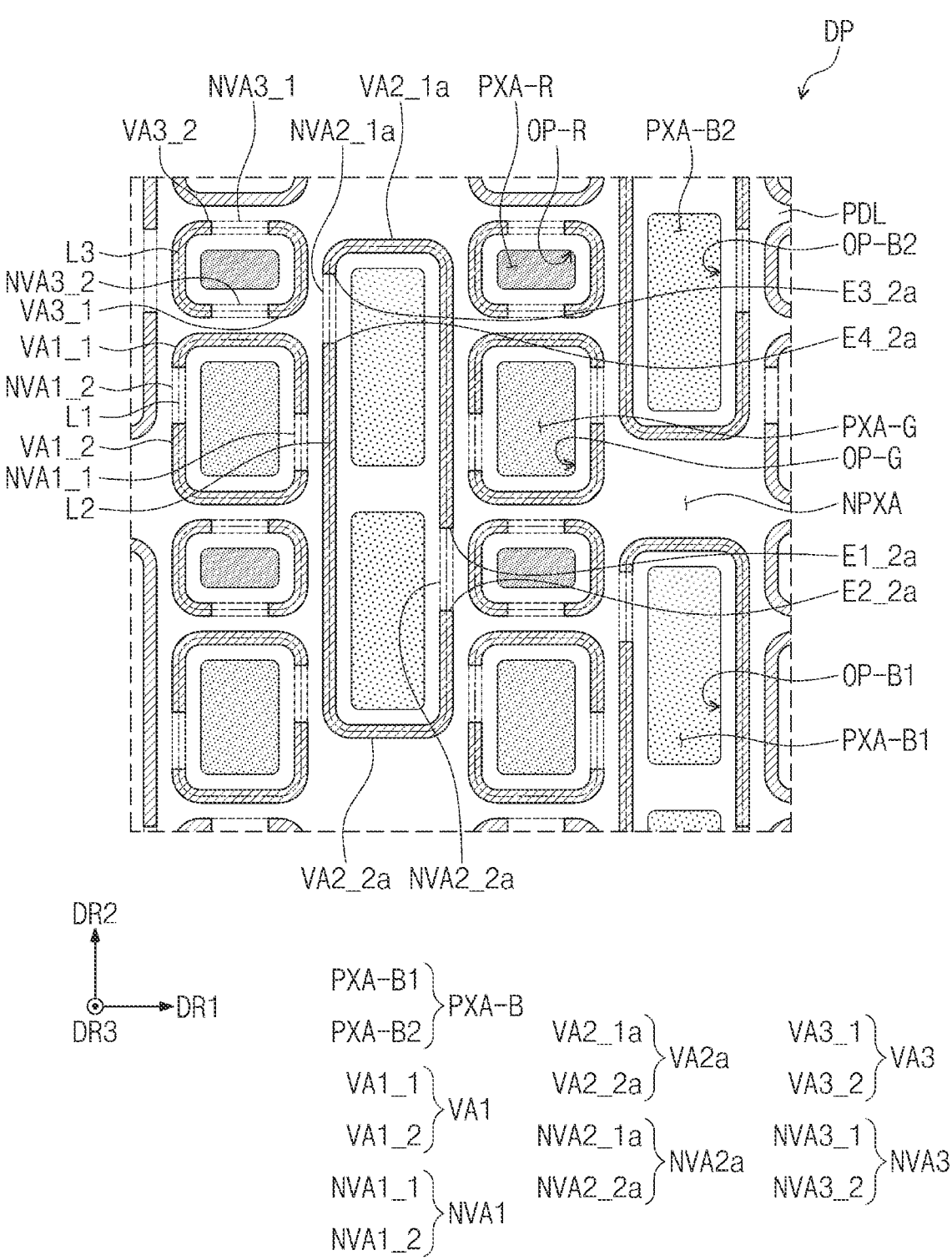

FIG. 9 is an enlarged plan view of a portion of a display panel according to an embodiment of the inventive concept. Same/similar reference numerals will be used for the same/similar elements as those described in FIGS. 4A and 4B, duplicate descriptions will be omitted, and differences will be mainly described.

Referring to FIG. 9, the second valley regions VA2$a$ may include (2-1)-th and (2-2)-th valley regions VA2_1$a$ and VA2_2$a$, and the second non-valley regions NVA2$a$ may include (2-1)-th and (2-2)-th non-valley regions NVA2_1$a$ and NVA2_2$a$. That is, according to this embodiment, each of the second valley regions VA2$a$ and the second non-valley regions NVA2$a$ may be provided in two portions.

In this embodiment, the (2-1)-th valley region VA2_1$a$ may enclose the first short side and the first long side of the (2-1)-th pixel region PXA-B1, and the (2-2)-th valley region VA2_2$a$ may enclose a portion of the first long side, the second short side, and the second long side of the (2-2)-th pixel region PXA-B2 and a portion of the second long side of the (2-1)-th pixel region PXA-B1.

One end E1_2$a$ of the (2-1)-th valley region VA2_1$a$ and one end E2_2$a$ of the (2-2)-th valley region VA2_2$a$ may face each other in the second direction DR2, and the other end of E3_2$a$ of the (2-1)-th valley region VA2_1$a$ and the other end E4_2$a$ of the (2-2)-th valley region VA2_2$a$ may face each other in the second direction DR2.

The (2-2)-th non-valley region NVA2_2$a$ may be disposed between one end E1_2$a$ of the (2-1)-th valley region VA2_1$a$ and one end E2_2$a$ of the (2-2)-th valley region VA2_2$a$, and the (2-1)-th non-valley region NVA2_1$a$ may be disposed between the other end E3_2$a$ of the (2-1)-th valley region VA2_1$a$ and the other end E4_2$a$ of the (2-2)-th valley region VA2_2$a$. Each of the (2-1)-th and (2-2)-th non-valley regions NVA2_1$a$ and NVA2_2$a$ may extend in the second direction DR2. That is, in this embodiment, the extension direction of the second non-valley regions NVA2$a$ may be the same as the extension direction of the first non-valley regions NVA1.

The (2-1)-th non-valley region NVA2_1$a$ may be disposed adjacent to the (2-1)-th pixel region PXA-B1, and the (2-2)-th non-valley region NVA2_2$a$ may be disposed adjacent to the (2-2)-th pixel region PXA-B2. That is, one non-valley region may be disposed adjacent to each of the second pixel regions PXA-B. In this embodiment, the (2-1)-th non-valley region NVA2_1$a$ may be disposed adjacent to the second long side of the (2-1)-th pixel region PXA-B1, and the (2-2)-th non-valley region NVA2_2$a$ may be disposed adjacent to the first long side of the (2-2)-th pixel region PXA-B2.

According to this embodiment, as a driving voltage is sufficiently provided to the second electrode CE (see FIG. 3B) disposed in one pixel region even through one non-valley region disposed adjacent to one pixel region, as long as the driving voltage does not increase to a certain level or more, the non-valley region adjacent to the one pixel region may be provided as one in number. By providing one non-valley region, it is possible to more effectively prevent a lateral leakage current from flowing from one pixel region to another pixel region adjacent to one side of the one pixel region, on which a non-valley region is not disposed.

Figure 10:
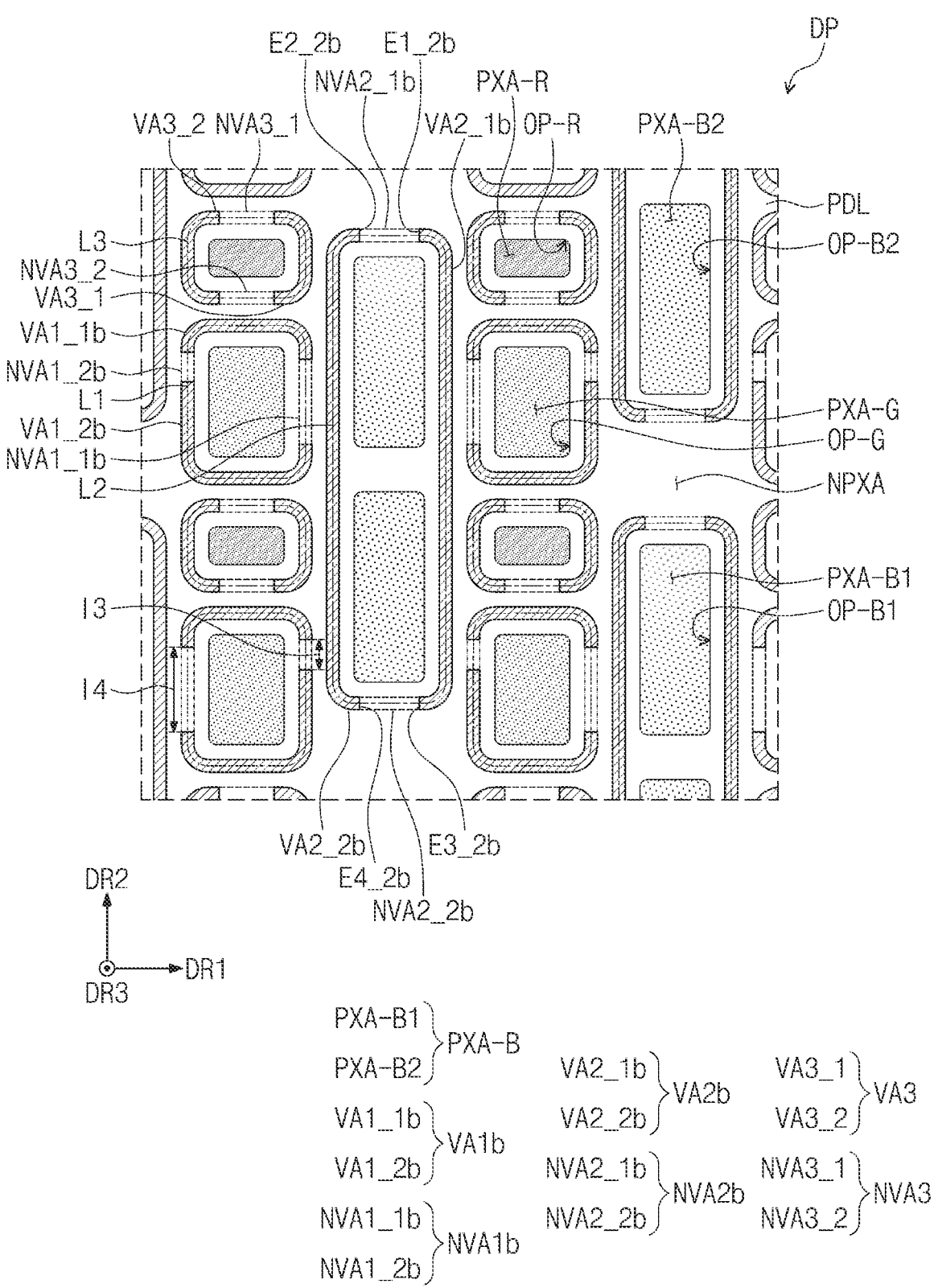

FIG. 10 is an enlarged plan view of a portion of a display panel according to an embodiment of the inventive concept. Same/similar reference numerals will be used for the same/similar elements as those described in FIGS. 4A, 4B, and 9, duplicate descriptions will be omitted, and differences will be mainly described.

Referring to FIG. 10, the second valley regions VA2$b$ may include the (2-1)-th and (2-2)-th valley regions VA2_1$b$ and VA2_2$b$, and the second non-valley regions NVA2$b$ may include the (2-1)-th and (2-2)-th non-valley regions NVA2_1$b$ and NVA2_2$b$. That is, according to this embodiment, each of the second valley regions VA2$b$ and the second non-valley regions NVA2$b$ may be provided as two in number.

In this embodiment, the (2-1)-th valley region VA2_1$b$ may enclose the first long side of the (2-1)-th pixel region PXA-B1 and the first long side of the (2-2)-th pixel region PXA-B2. The (2-2)-th valley region VA2_2$b$ may enclose the second long side of the (2-1)-th pixel region PXA-B1 and the second long side of the (2-2)-th pixel region PXA-B2.

One end E1_2$b$ of the (2-1)-th valley region VA2_1$b$ and one end E2_2$b$ of the (2-2)-th valley region VA2_2$b$ may face each other in the first direction DR1, and the other end E3_2$b$ of the (2-1)-th valley region VA2_1$b$ and the other end E4_2$b$ of the (2-2)-th valley region VA2_2$b$ may face each other in the first direction DR1. Each of the (2-1)-th and (2-2)-th non-valley regions NVA2_1$b$ and NVA2_2$b$ may extend in the first direction DR1. That is, in this embodiment, the extension direction of the second non-valley regions NVA2$b$ may be perpendicular to the extension direction of the first non-valley regions NVA1$b$.

The (2-1)-th non-valley region NVA2_1$b$ may be disposed adjacent to the (2-1)-th pixel region PXA-B1, and the (2-2)-th non-valley region NVA2_2$b$ may be disposed adjacent to the (2-2)-th pixel region PXA-B2. That is, one non-valley region may be disposed adjacent to each of the second pixel regions PXA-B. In this embodiment, the (2-1)-th non-valley region NVA2_1$b$ may be disposed adjacent to the first short side of the (2-1)-th pixel region PXA-B1, and the (2-2)-th non-valley region NVA2_2$b$ may be disposed adjacent to the second short side of the (2-2)-th pixel region PXA-B2.

According to this embodiment, as the second non-valley regions NVA2$b$ are disposed to extend in a direction perpendicular to the extension direction of the first non-valley regions NVA1$b$, the first and second non-valley regions NVA1$b$ and NVA2$b$ may not face each other.

In this embodiment, in order for the shortest distance between the first and second non-valley regions NVA1$b$ and NVA2$b$ to be about 10 micrometers or more, the length 13 of the (1-1)-th non-valley region NVA1_1$b$ in the second direction DR2 and the length 14 of the (1-2)-th non-valley region NVA1_2$b$ in the second direction DR2 may be set to be different from each other.

For example, in the first non-valley regions NVA1$b$ disposed on the left side of the (2-2)-th pixel region PXA-B2, in order to increase the shortest distance between the (1-1)-th non-valley region NVA1_1$b$ and the (2-2)-th non-valley region NVA2_2$b$ adjacent to each other, the length 13 of the (1-1)-th non-valley region NVA1_1$b$ may be set to be smaller than the length 14 of the (1-2)-th non-valley region NVA1_2$b$.

In addition, in the first non-valley regions NVA1$b$ disposed on the right side of the (2-2)-th pixel region PXA-B2, in order to increase the shortest distance between the (1-2)-th non-valley region NVA1_2b and the (2-2)-th non-valley region NVA2_2b, the length of the (1-2)-th non-valley region NVA1_2b may be set to be smaller than the length of the (1-1)-th non-valley region NVA1_1b.

Figure 11:
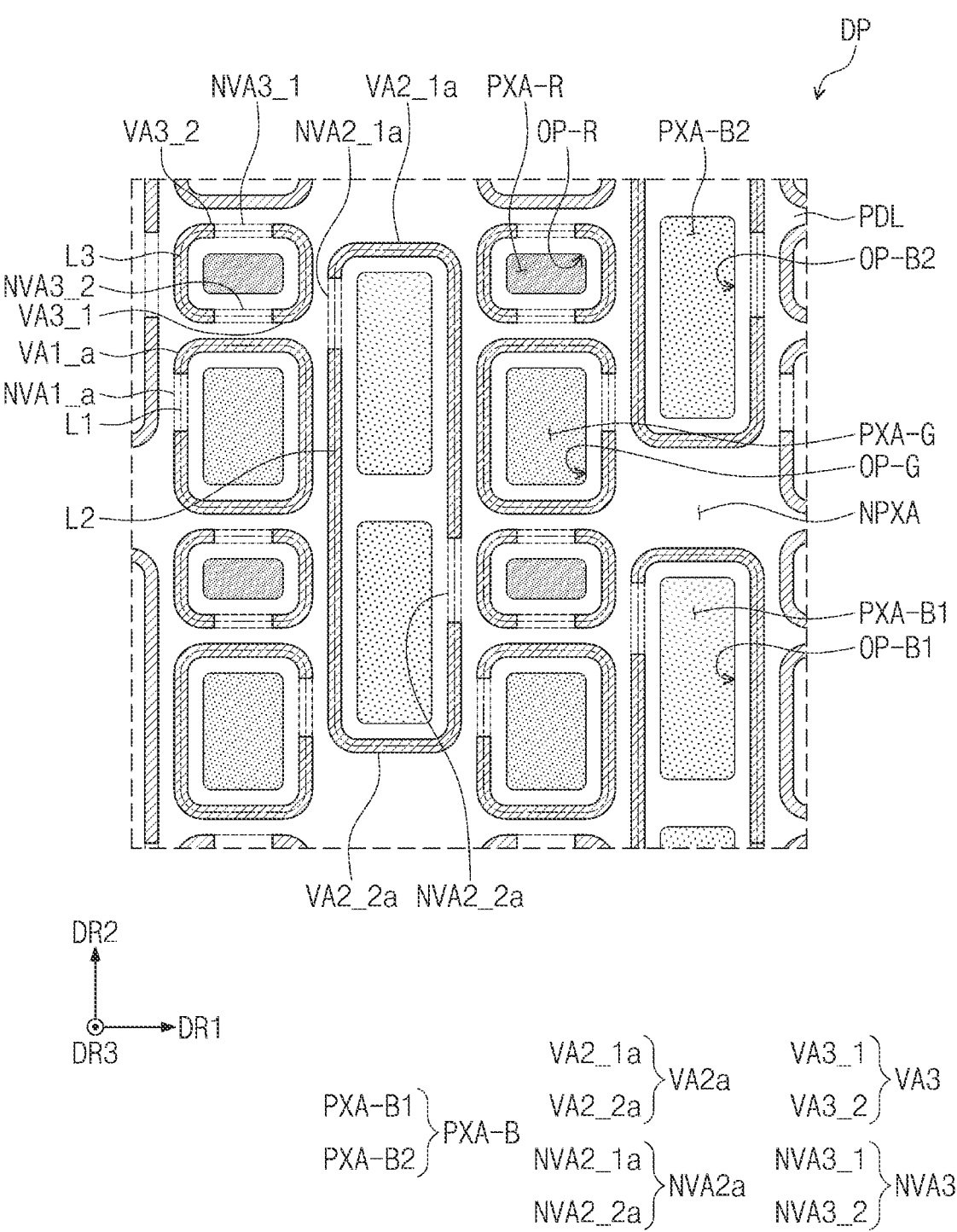

FIG. 11 is an enlarged plan view of a portion of a display panel according to an embodiment of the inventive concept. Same/similar reference numerals will be used for the same/similar elements as those described in FIGS. 4A, 4B, 9, and 10, duplicate descriptions will be omitted, and differences will be mainly described.

Referring to FIG. 11, the pixel defining layer PDL according to this embodiment may include one first valley region VA1_a and one first non-valley region NVA1_a disposed on a corresponding first virtual line L1. That is, in this embodiment, the first non-valley region NVA1_a may be provided as one in number on one first virtual line L1.

One end of the first valley region VA1_a and the other end opposite of the one end of the first valley region VA1_a may face each other in the second direction DR2. One first non-valley region NVA1_a (hereinafter referred to as first non-valley region NVA1_a) may be disposed between one end and the other end of the first valley region VA1_a and extend in the second direction DR2. In an embodiment of the inventive concept, the first non-valley region NVA1_a may be disposed adjacent to any one of the first and second long sides of the first pixel region PXA-G.

For example, in the first valley region VA1_a and the first non-valley region NVA1_a disposed on the left side of the (2-1)-th pixel region PXA-B1, in order to increase the shortest distance between the first non-valley region NVA1_a and the (2-1)-th non-valley regions NVA2_1a disposed on the left side of the (2-1)-th pixel region PXA-B1, the first non-valley region NVA1_a may be disposed adjacent to the second long side of the first pixel region PXA-G.

In addition, in the first valley region VA1_a and the first non-valley region NVA1_a disposed on the right side of the (2-1)-th pixel region PXA-B1, in order to increase the shortest distance between the first non-valley region NVA1_a and the (2-2)-th non-valley region NVA2_2a disposed on the right side of the (2-2)-th pixel region PXA-B2, the first non-valley region NVA1_a may be disposed adjacent to the first long side of the first pixel region PXA-G.

In other words, each of the first non-valley regions NVA1_a may be disposed adjacent to a long side, which is adjacent to the (2-2)-th pixel region PXA-B2, among the first and second long sides of the first pixel region PXA-G. Each of the first non-valley regions NVA1_a may be disposed between the first pixel region PXA-G and the (2-2)-th pixel region PXA-B2.

Meanwhile, the arrangement of the first non-valley region NVA1_a is not limited thereto, and the first non-valley region NVA1_a may be disposed between the first pixel region PXA-G and the (2-1)-th pixel region PXA-B1 and may be disposed adjacent to one identical side of the pixel region PXA-G.

FIG. 11 exemplarily illustrates that the (2-1)-th and (2-2)-th non-valley regions NVA2_1a and NVA2_2a are respectively adjacent to one long side of the (2-1)-th pixel region PXA-B1 and one long side of the (2-2)-th pixel region PXA-B2, and each of the (2-1)-th and (2-2)-th non-valley regions NVA2_1a and NVA2_2a are disposed to extend in the second direction DR2, but the embodiment of the inventive concept is not limited thereto.

For example, as described above in FIG. 10, the (2-1)-th and (2-2)-th non-valley regions NVA2_1b and NVA2_2b may be respectively adjacent to one short side of the (2-1)-th pixel region PXA-B1 and one short side of the (2-2)-th pixel region PXA-B2, and each of the (2-1)-th and (2-2)-th non-valley regions NVA2_1b and NVA2_2b may be disposed to extend in the first direction DR1. In this case, so as for the first non-valley regions NVA1_a to be disposed away from the (2-2)-th non-valley region NVA2_2b (see FIG. 10) adjacent to the (2-2)-th pixel region PXA-B2, each of the first non-valley regions NVA1_a may be disposed between the first pixel region PXA-G and the (2-1)-th pixel region PXA-B1.

Meanwhile, although it is exemplarily illustrated that one first valley region VA1_a and one first non-valley region NVA1_a are disposed on a corresponding first virtual line L1, one third valley region VA3 and one third non-valley region NVA3 may be disposed on a corresponding third virtual line L3.

Figure 12:
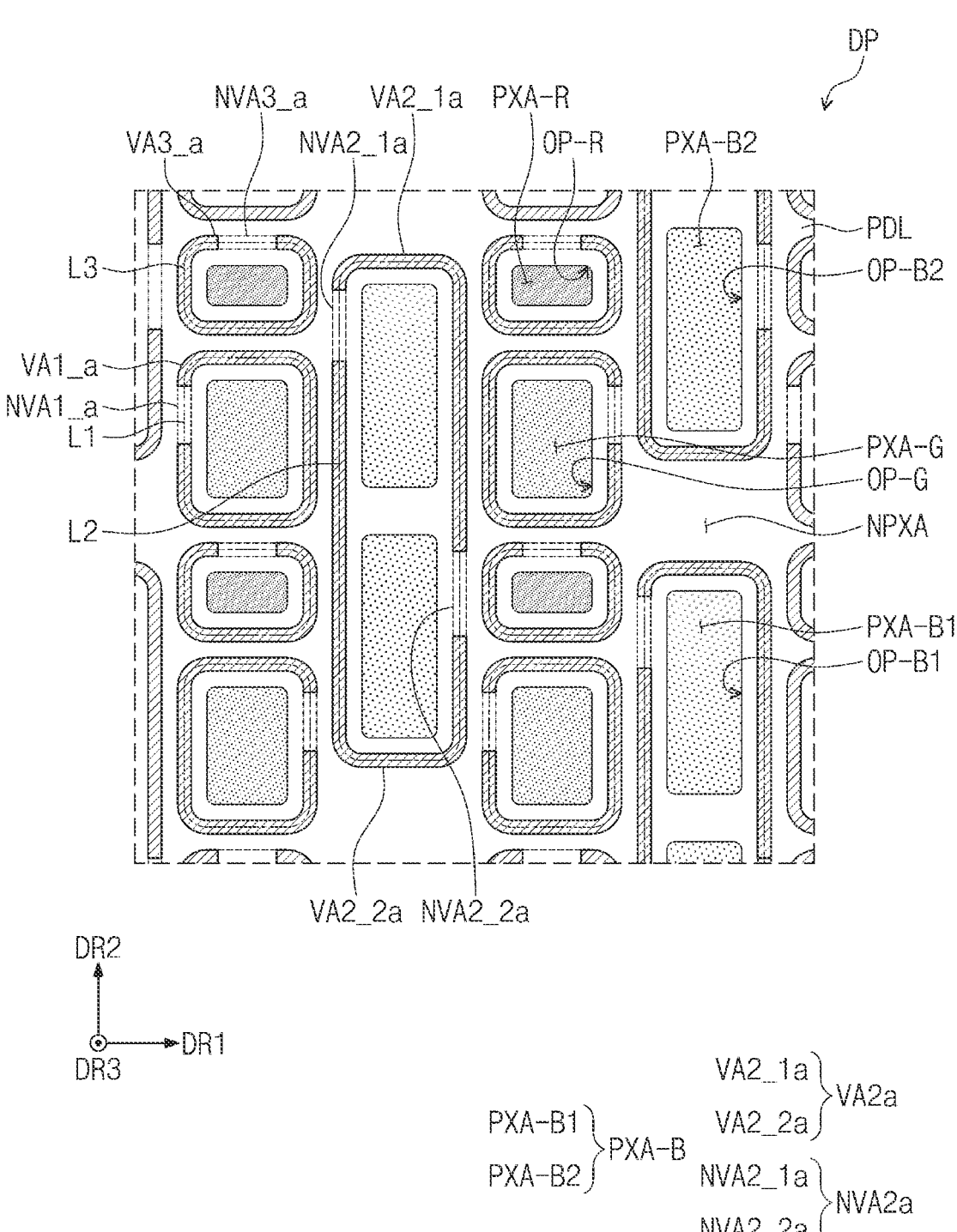

FIG. 12 is an enlarged plan view of a portion of a display panel according to an embodiment of the inventive concept. Same/similar reference numerals will be used for the same/similar elements as those described in FIGS. 4A, 4B, and 9 to 11, duplicate descriptions will be omitted, and differences will be mainly described.

Referring to FIG. 12, the pixel defining layer PDL according to this embodiment may include one first valley region VA1_a and one first non-valley region NVA1_a disposed on a corresponding first virtual line L1 and one third valley region VA3_a and one third non-valley region NVA3_a disposed on a corresponding third virtual line L3. That is, in this embodiment, each of the first non-valley region NVA1_a disposed on one first virtual line L1 and the third non-valley region NVA3_a disposed on one third virtual line L3 may be provided as one in number.

One first non-valley region NVA1_a (hereinafter, first non-valley region NVA1_a) may extend in the second direction DR2, and one third non-valley region NVA3_a (hereinafter, third non-valley region NVA3_a) may extend in the first direction DR1. That is, the extension direction of the third non-valley regions NVA3_a may be perpendicular to the extension direction of the first non-valley regions NVA1_a.

Although FIG. 12 exemplarily illustrates that all of the third non-valley regions NVA3_a are disposed adjacent to the first long side of a corresponding third pixel region PXA-R, the embodiment of the inventive concept is not limited thereto. For example, all of the third non-valley regions NVA3_a may be disposed adjacent to the second long side of the corresponding third pixel region PXA-R. Alternatively, some of the third non-valley regions NVA3_a may be disposed adjacent to the first long side of the corresponding third pixel region PXA-R, and other third non-valley regions NVA3_a may be disposed adjacent to the second long side of the corresponding third pixel region PXA-R.

The first and third non-valley regions NVA1_a and NVA3_a may be disposed without limitation as long as a shortest distance between different non-valley regions can be secured at a certain level or more. In an embodiment of the inventive concept, the shortest distance may be about 10 micrometers or more.

Figure 13:
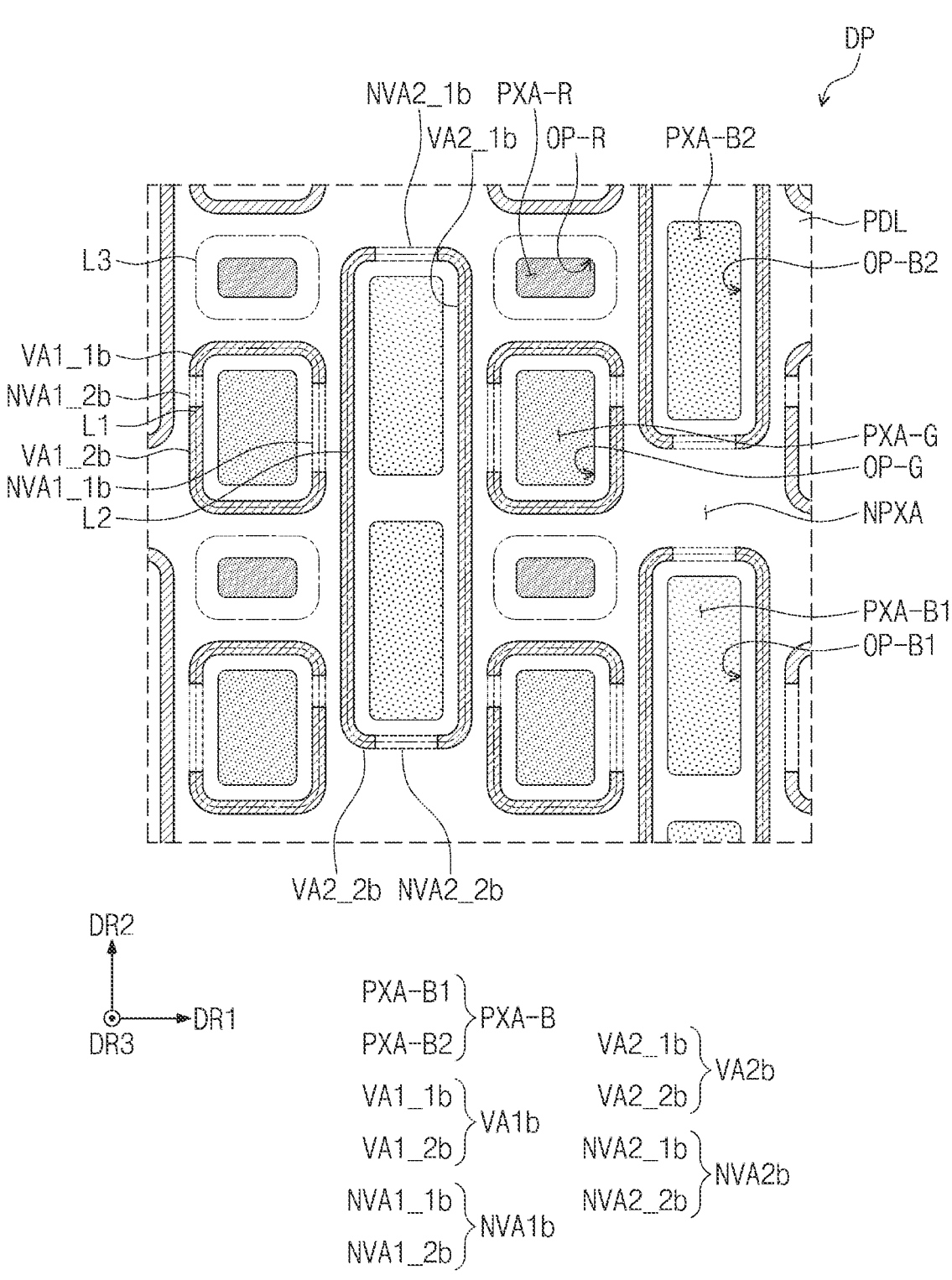

FIG. 13 is an enlarged plan view of a portion of a display panel according to an embodiment of the inventive concept. Same/similar reference numerals will be used for the same/similar elements as those described in FIGS. 4A, 4B, and 7 to 12, duplicate descriptions will be omitted, and differences will be mainly described.

Referring to FIG. 13, the first valley regions VA1*b* and the first non-valley regions NVA1*b* may be disposed on the first virtual line L1, and the second valley regions VA2*b* and the second non-valley regions NVA2*b* may be disposed on the second virtual line L2, but the third valley region may not be disposed on the third virtual line L3. That is, a valley pattern enclosing the third pixel opening OP-R (or the third pixel region PXA-R) may not be defined in the pixel defining layer PDL. Alternatively, it may be considered that only the third non-valley region is disposed on the third virtual line L3.

As the amount of lateral leakage current flowing from one of the first to third pixels to other adjacent pixels is relatively small, when the gray crushing and parasitic emission of one pixel is at an acceptable level of the display efficiency and display quality of the display panel DP (see FIG. 2), a valley region enclosing the pixel may be omitted.

Accordingly, while a first valley region VA1*b* and a second valley region VA2*b* are disposed between the first and (2-1)-th regions PXA-G and PXA-B1 and between the first and (2-2)-th pixel regions PXA-G and PXA-B2, only one valley region may be disposed between the first and third pixel regions PXA-G and PXA-R, between the (2-1)-th and third pixel regions PXA-B1 and PXA-R, and between the (2-2)-th and third pixel regions PXA-B2 and PXA-R. Through this, by disposing valley regions only in pixels that need to block a leakage current in a lateral direction, it is possible not only to prevent a lateral leakage current from occurring, but also to prevent a driving voltage from rising excessively.

Meanwhile, FIG. 13 exemplarily illustrates that the third valley region enclosing the third pixel opening OP-R is not disposed, but the embodiment of the inventive concept is not limited thereto. For example, according to the gray crushing and parasitic emission of each of the first and second pixels, the first valley region enclosing the first pixel opening OP-G may not be disposed, or the second valley region enclosing the second pixel opening OP-B may not be disposed.

In this embodiment, the first and second valley regions VA1*b* and VA2*b* and the first and second non-valley regions NVA1*b* and NVA2*b* may have the same shapes as the first and second valley regions VA1*b* and VA2*b* and the first and second non-valley regions NVA1*b* and NVA2*b* described above with reference to FIG. 10. That is, the first non-valley regions NVA1*b* may extend in the first direction DR1 and the second non-valley regions NVA2*b* may extend in the second direction DR2. Through this, the first and second non-valley regions NVA1*b* and NVA2*b* may not face the third pixel region PXA-R, and although the third valley region is omitted, it is possible to effectively prevent a lateral leakage current from flowing from the first and second pixels to the third pixel.

Meanwhile, FIG. 13 exemplarily illustrates the shape and arrangement of the first and second valley regions VA1*b* and VA2*b* and the first and second non-valley regions NVA1*b* and NVA2*b*, but the embodiment of the inventive concept is not limited thereto. The shape and arrangement of the non-valley regions may be freely modified as long as pixels, which are not enclosed by valley regions, do not face each other.

According to this inventive concept, a lateral leakage current may be prevented by the valley regions disposed between adjacent pixels. Through this, it is possible to prevent color mixing between adjacent pixels and luminance decrease so that a display panel with improved display quality and display efficiency may be provided.

According to this inventive concept, non-valley regions may be disposed between adjacent pixels so that a driving voltage may be provided to the pixels. In the display panel according to an embodiment of the inventive concept, a lateral leakage current may be effectively blocked by disposing adjacent non-valley regions to be spaced apart from each other by a predetermined distance.

Although the inventive concept has been described with reference to the above embodiments, those skilled in the art will understand that various modifications and changes can be made without departing from the spirit and scope of the inventive concept described in the following claims. Therefore, the technical scope of the inventive concept should not be limited to the contents described in the detailed description of the specification, but should be determined by the claims below.

What is claimed is:

1. A display panel comprising:
a base layer comprising a first pixel region, a second pixel region at least partially spaced apart from the first pixel region in a first direction, and a non-pixel region adjacent to the first and second pixel regions;
a pixel defining layer disposed on the base layer and having first and second pixel openings which are defined in the pixel defining layer and respectively correspond to the first and second pixel regions; and
a light-emitting portion overlapping the first and second pixel regions, disposed on the pixel defining layer, and comprising a charge generation layer,
wherein the pixel defining layer comprises:
at least one first valley region and at least one first non-valley region disposed on a first virtual line completely enclosing the first pixel opening; and
at least one second valley region and at least one second non-valley region disposed on a second virtual line completely enclosing the second pixel opening,
wherein:
the at least one first non-valley region and the at least one second non-valley region do not face each other in a plan view; and
a shortest distance between the at least one first non-valley region and the at least one second non-valley region is about 10 micrometers or more, wherein
one end of the at least one first valley region is connected to one end of the at least one first non-valley region, and
one end of the at least one second valley region is connected to one end of the at least one second non-valley region.

2. The display panel of claim 1, wherein the at least one first non-valley region is disposed between the one end of the at least one first valley region and the other end of the at least one first valley region.

3. The display panel of claim 1, wherein:
the at least one first valley region comprises (1-1)-th and (1-2)-th valley regions spaced apart from each other; and
the at least one first non-valley region comprises (1-1)-th and (1-2)-th non-valley regions extending in a same direction as each other,
wherein:
the (1-1)-th non-valley region is disposed between one end of the (1-1)-th valley region and one end of the (1-2)-th valley region; and
the (1-2)-th non-valley region is disposed between an other end of the (1-1)-th valley region and an other end of the (1-2)-th valley region.

4. The display panel of claim 3, wherein:

a length of the (1-1)-th non-valley region in an extension direction of the (1-1)-th non-valley region and a length of the (1-2)-th non-valley region in an extension direction of the (1-2)-th non-valley region are equal to each other; and at least a portion of the (1-1)-th non-valley region overlaps the (1-1)-th valley region when viewed from a direction perpendicular to the extension direction of the (1-1)-th non-valley region.

5. The display panel of claim 1, wherein a length of the (1-1)-th non-valley region in an extension direction of the (1-1)-th non-valley region and a length of the (1-2)-th non-valley region in an extension direction of the (1-2)-th non-valley region are different from each other.

6. The display panel of claim 1, wherein:

the at least one first non-valley region extends in a second direction perpendicular to the first direction; and the at least one second non-valley region extends in any one of the first and second directions.

7. The display panel of claim 6, further comprising a plurality of second pixel regions comprising the second pixel region and a plurality of second pixel openings comprising the second pixel opening, wherein:

the plurality of second pixel regions comprise (2-1)-th pixel regions and (2-2)-th pixel regions that are alternately arranged in the second direction;

the plurality of second pixel openings comprise (2-1)-th pixel openings respectively corresponding to the (2-1)-th pixel regions and (2-2)-th pixel openings respectively corresponding to the (2-2)-th pixel regions; and the second virtual line completely encloses a (2-1)-th pixel opening and a (2-2)-th pixel opening, which are adjacent to each other, among the (2-1)-th pixel openings and the (2-2)-th pixel openings.

8. The display panel of claim 7, wherein the second pixel regions emit light having a wavelength shorter than a wavelength of light emitted from the first pixel regions.

9. The display panel of claim 7, wherein:

the at least one second valley region comprises (2-1)-th and (2-2)-th valley regions spaced apart from each other; and the at least one second non-valley region comprises (2-1)-th and (2-2)-th non-valley regions extending in a same direction as each other, wherein:

the (2-1)-th non-valley region is adjacent to the (2-1)-th pixel opening and disposed between one end of the (2-1)-th valley region and one end of the (2-2)-th valley region; and the (2-2)-th non-valley region is adjacent to the (2-2)-th pixel opening and disposed between an other end of the (2-1)-th valley region and an other end of the (2-2)-th valley region.

10. The display panel of claim 9, wherein:

each of the (2-1)-th and (2-2)-th non-valley regions extends in the first direction; and the (2-1)-th and (2-2)-th non-valley regions are spaced apart from each other in the second direction with the (2-1)-th and (2-2)-th pixel openings interposed between the (2-1)-th and (2-2)-th non-valley regions.

11. The display panel of claim 9, wherein:

each of the (2-1)-th and (2-2)-th non-valley regions extends in the second direction; and a direction in which the (2-1)-th non-valley region is spaced apart from the (2-1)-th pixel opening and a direction in which the (2-2)-th non-valley region is spaced apart from the (2-2)-th pixel opening are opposite to each other.

12. The display panel of claim 7, wherein:

the at least one second valley region comprises (2-1)-th, (2-2)-th, (2-3)-th, and (2-4)-th valley regions spaced apart from each other; and the at least one second non-valley region comprises (2-1)-th, (2-2)-th, (2-3)-th, and (2-4)-th non-valley regions extending in the second direction, wherein:

the (2-1)-th non-valley region is disposed between one end of the (2-1)-th valley region and one end of the (2-2)-th valley region;

the (2-2)-th non-valley region is disposed between an other end of the (2-2)-th valley region and one end of the (2-3)-th valley region;

the (2-3)-th non-valley region is disposed between an other end of the (2-3)-th valley region and one end of the (2-4)-th valley region; and the (2-4)-th non-valley region is disposed between an other end of the (2-4)-th valley region and an other end of the (2-1)-th valley region.

13. The display panel of claim 12, wherein:

each of the (2-1)-th and (2-2)-th non-valley regions is adjacent to the (2-1)-th pixel opening, wherein the (2-1)-th and (2-2)-th non-valley regions are respectively spaced apart from the (2-1)-th pixel opening in the first direction and in a direction opposite to the first direction; and each of the (2-3)-th and (2-4)-th non-valley regions is adjacent to the (2-2)-th pixel opening, wherein the (2-3)-th and (2-4)-th non-valley regions are respectively spaced apart from the (2-2)-th pixel opening in the first direction and in the direction opposite to the first direction.

14. The display panel of claim 1, wherein:

the at least one first non-valley region extends in the first direction; and the at least one second non-valley region extends in a second direction perpendicular to the first direction.

15. The display panel of claim 14, wherein the second pixel regions emit light having a wavelength longer than a wavelength of light emitted from the first pixel regions.

16. The display panel of claim 14, wherein the at least one second non-valley region is disposed between one end of the at least one second valley region and an other end of the at least one second valley region.

17. The display panel of claim 14, wherein:

the at least one second valley region comprises (2-1)-th and (2-2)-th valley regions spaced apart from each other; and the at least one second non-valley region comprises (2-1)-th and (2-2)-th non-valley regions, wherein the (2-1)-th non-valley region is disposed between one end of the (2-1)-th valley region and one end of the (2-2)-th valley region; and the (2-2)-th non-valley region is disposed between an other end of the (2-1)-th valley region and an other end of the (2-2)-th valley region.

18. The display panel of claim 17, wherein the (2-1)-th non-valley region entirely overlaps the (2-2)-th non-valley region when viewed from the first direction.

19. The display panel of claim 17, wherein the (2-1)-th non-valley region overlaps at least one of the (2-1)-th and (2-2)-th valley regions when viewed from the first direction.

20. The display panel of claim 1, wherein:

the base layer further comprises a third pixel region emitting light of a color different from a light emitted from the first pixel region and a light emitted from the second pixel region; and the pixel defining layer has a third pixel opening defined in the pixel defining layer, spaced apart from the first and second pixel openings, and corresponding to a third pixel region.

21. The display panel of claim 20, wherein the pixel defining layer further comprises at least one third valley region and at least one third non-valley region disposed on a third virtual line completely enclosing the third pixel opening, wherein:

the at least one third non-valley region does not face the at least one first non-valley region and the at least one second non-valley region; and each of a shortest distance between the at least one third non-valley region and the at least one first non-valley region and a shortest distance between the at least one third non-valley region and the at least one second non-valley region is about 10 micrometers or more.

22. The display panel of claim 20, wherein the pixel defining layer comprises a third non-valley region completely enclosing the third pixel opening.

23. The display panel of claim 1, wherein a first valley pattern corresponding to the at least one first valley region and a second valley pattern corresponding to the at least one second valley region are defined in the pixel defining layer, where each of the first and second valley patterns is defined as being recessed along a thickness direction of the pixel defining layer from an upper surface of the pixel defining layer.

24. The display panel of claim 23, wherein:

the display panel further comprises first electrodes disposed on the base layer, at least partially covered by the pixel defining layer, and respectively overlapping the first and second pixel regions; and a first angle formed between the upper surface of each of the first electrodes and an outer side surface of the pixel defining layer is different from a second angle formed between the upper surface of each of the first electrodes and an inner side surface of the pixel defining layer defining the first valley pattern.

25. The display panel of claim 24, wherein the second angle is about 70 degrees to about 90 degrees.

26. The display panel of claim 23, wherein a thickness of a portion of the light-emitting portion disposed on an inner side surface of the pixel defining layer defining the first valley pattern is smaller than a thickness of a portion of the light-emitting portion disposed on the upper surface of the pixel defining layer.

27. The display panel of claim 23, further comprising a second electrode overlapping the first and second pixel regions and disposed on the light-emitting portion, wherein a first thickness of a portion of the second electrode disposed on the upper surface of the pixel defining layer is different from a second thickness of a portion of the second electrode disposed on an inner side surface of the pixel defining layer defining the first valley pattern.

28. The display panel of claim 27, wherein the second thickness is about 0.125 times to about 0.25 times the first thickness.

29. The display panel of claim 23, further comprising a dummy pattern disposed on the upper surface of the pixel defining layer and having first and second dummy openings defined in the dummy pattern and respectively corresponding to the at least one first valley region and the at least one second valley region, wherein:

a lower surface of the dummy pattern overlapping the at least one first valley region and connected to an inner side surface of the dummy pattern defining the first dummy opening is uncovered by the pixel defining layer; and a portion of the light-emitting portion disposed on the upper surface of the pixel defining layer and a portion of the light-emitting portion disposed in the first valley pattern are not connected to each other.

30. The display panel of claim 1, further comprising:

first electrodes disposed on the base layer and respectively overlapping the first and second pixel regions; and a second electrode overlapping the first and second pixel regions and disposed on the light-emitting portion, wherein the light-emitting portion further comprises:

a first light-emitting layer disposed between the first electrodes and the charge generation layer; and a second light-emitting layer disposed between the charge generation layer and the second electrode.

31. The display panel of claim 30, wherein the light-emitting portion further comprises:

a hole control layer disposed between the first electrodes and the first light-emitting layer; and an electron control layer disposed between the first light-emitting layer and the charge generation layer.

32. An electronic device comprising:

a base layer comprising a first pixel region, (2-1)-th and (2-2)-th pixel regions at least partially spaced apart from each other in a first direction with the first pixel region interposed between the (2-1)-th and (2-2)-th pixel regions, and a non-pixel region adjacent to the first pixel region and the (2-1)-th and (2-2)-th pixel regions;

a pixel defining layer disposed on the base layer and having a first pixel opening defined in the pixel defining layer and corresponding to the first pixel region and (2-1)-th and (2-2)-th pixel openings defined in the pixel defining layer and respectively corresponding to the (2-1)-th and (2-2)-th pixel regions; and a light-emitting portion overlapping the first pixel region and the (2-1)-th and (2-2)-th pixel regions, disposed on the pixel defining layer, and comprising a charge generation layer, wherein the pixel defining layer comprises:

at least one first valley region and at least one first non-valley region disposed on a first virtual line completely enclosing the first pixel opening;

at least one first group valley region and at least one first group non-valley region disposed on a (2-1)-th virtual line completely enclosing the (2-1)-th pixel opening; and at least one second group valley region and at least one second group non-valley region disposed on a (2-2)-th virtual line completely enclosing the (2-2)-th pixel opening, wherein:

the at least one first group non-valley region and the at least one second group non-valley region are not disposed on a same line in the first direction; and on a plane, the at least one first valley region is asymmetric with respect to a reference line passing through a center of the first pixel region and extending in a second direction perpendicular to the first direction.

\* \* \* \* \*